United States Patent
Seifert et al.

(10) Patent No.: US 11,402,415 B2
(45) Date of Patent: Aug. 2, 2022

(54) METHOD AND SYSTEM FOR PROVIDING ENERGY AUDITS

(71) Applicants: Michael J. Seifert, Hudson, OH (US); Rodney J. Seifert, Medina, OH (US); Jeffrey A. Seifert, Glen Ellyn, IL (US)

(72) Inventors: Michael J. Seifert, Hudson, OH (US); Rodney J. Seifert, Medina, OH (US); Jeffrey A. Seifert, Glen Ellyn, IL (US)

(73) Assignee: Streamlinx, LLC, Naperville, IL (US)

(*) Notice: Subject to any disclaimer, the term of this patent is extended or adjusted under 35 U.S.C. 154(b) by 0 days.

(21) Appl. No.: 17/070,720

(22) Filed: Oct. 14, 2020

(65) Prior Publication Data
US 2022/0113690 A1    Apr. 14, 2022

(51) Int. Cl.
*G01R 19/25* (2006.01)
*G06F 17/40* (2006.01)

(52) U.S. Cl.
CPC .. *G01R 19/2513* (2013.01); *G05B 2219/2614* (2013.01); *G06F 17/40* (2013.01); *Y04S 50/16* (2018.05)

(58) Field of Classification Search
CPC .............. G01R 19/2513; Y04S 50/16; G05B 2219/2614; G06F 17/40
See application file for complete search history.

(56) References Cited

U.S. PATENT DOCUMENTS

| | | | |
|---|---|---|---|
| 5,983,010 A | 11/1999 | Murdock et al. | |
| 8,095,393 B2 | 1/2012 | Seifert et al. | |
| 8,285,603 B2 | 10/2012 | Carlin et al. | |
| 8,463,765 B2 | 6/2013 | Lesavich | |
| 8,494,922 B2 | 7/2013 | Carlin, Jr. et al. | |
| 8,805,000 B2 | 8/2014 | Derby et al. | |
| 9,026,261 B2 | 5/2015 | Bukhin | |
| 9,026,405 B2 | 5/2015 | Buckley | |

(Continued)

FOREIGN PATENT DOCUMENTS

| | | | |
|---|---|---|---|
| JP | 2007089265 A | * | 4/2007 |
| JP | 2013059069 A | * | 3/2013 |

OTHER PUBLICATIONS

Wilson Amplifiers, "11 Major Building Materials that kill your cell phone reception", Jan. 28, 2020 (Year: 2020).*

(Continued)

*Primary Examiner* — Tarun Sinha
*Assistant Examiner* — Yossef Korang-Beheshti
(74) *Attorney, Agent, or Firm* — Lesavich High-Tech Law Group, S.C.; Stephen Lesavich

(57) ABSTRACT

A method and system for providing energy audits including installation, verification and inspection of energy consuming components and energy producing components. An energy audit is conducted offline on an energy audit application on a network device for energy consuming components (e.g., lighting, heating, ventilation, air condition, etc.) and energy producing components (e.g., solar, wind, water, etc.) and automatically synchronized to a server network device when the network device is able to connect to a communications network and go on-line. Energy audit templates are provided to ensure all energy consuming components and energy producing components are fully defined and consistently identified on an electronic floorplan for a commercial or industrial building.

23 Claims, 11 Drawing Sheets

(56) References Cited

U.S. PATENT DOCUMENTS

| | | | |
|---|---|---|---|
| 9,037,564 B2 | 5/2015 | Lesavich et al. | |
| 9,090,203 B2 | 7/2015 | Seifert | |
| 9,137,250 B2 | 9/2015 | Lesavich et al. | |
| 9,218,632 B2 | 12/2015 | Venkatakrishnan et al. | |
| 9,361,479 B2 | 6/2016 | Lesavich et al. | |
| 9,569,771 B2 | 2/2017 | Lesavich et al. | |
| 9,782,936 B2 | 10/2017 | Glunz et al. | |
| 9,817,922 B2 | 11/2017 | Glunz et al. | |
| 9,863,979 B2 | 1/2018 | Kymissis et al. | |
| 9,958,360 B2 | 5/2018 | Dasgupta | |
| 10,274,916 B2 | 4/2019 | Shen et al. | |
| 10,366,378 B1* | 7/2019 | Han | G06Q 20/425 |
| 10,867,282 B2 | 12/2020 | Glunz | |
| 10,949,805 B2 | 3/2021 | Glunz | |
| 10,956,497 B1* | 3/2021 | Plymale | G06F 16/56 |
| 10,997,553 B2 | 5/2021 | McLinden et al. | |
| 11,030,709 B2 | 6/2021 | McLinden et al. | |
| 2004/0107114 A1* | 6/2004 | Curtis | G06Q 50/184 |
| | | | 700/275 |
| 2006/0075269 A1* | 4/2006 | Liong | H04L 12/12 |
| | | | 713/300 |
| 2006/0241982 A1 | 10/2006 | Seifert et al. | |
| 2011/0029341 A1 | 2/2011 | Muse | |
| 2011/0208710 A1 | 8/2011 | Lesavich | |
| 2012/0053740 A1 | 3/2012 | Venkatakrishnan | |
| 2012/0221371 A1* | 8/2012 | Hegazy | G06Q 10/087 |
| | | | 705/7.25 |
| 2012/0278622 A1 | 11/2012 | Lesavich et al. | |
| 2013/0262040 A1* | 10/2013 | Buckley | G06F 30/13 |
| | | | 703/1 |
| 2014/0019319 A1 | 1/2014 | Derby | |
| 2014/0052303 A1 | 2/2014 | Venkatakrishnan | |
| 2014/0189792 A1 | 7/2014 | Lesavich et al. | |
| 2014/0310365 A1* | 10/2014 | Sample | H04L 51/16 |
| | | | 709/206 |
| 2014/0368324 A1 | 12/2014 | Seifert | |
| 2014/0368642 A1 | 12/2014 | Balazs | |
| 2015/0248502 A1 | 9/2015 | Glunz et al. | |
| 2015/0308856 A1* | 10/2015 | Srinivasan | H04L 67/125 |
| | | | 340/870.02 |
| 2015/0366035 A1* | 12/2015 | Baek | H05B 47/19 |
| | | | 315/131 |
| 2015/0379301 A1 | 12/2015 | Lesavich et al. | |
| 2016/0239342 A1* | 8/2016 | Miry | G06F 9/5011 |
| 2016/0246271 A1 | 8/2016 | Shen | |
| 2016/0266594 A1* | 9/2016 | Kauffman | G06Q 50/06 |
| 2016/0321654 A1 | 11/2016 | Lesavich et al. | |
| 2016/0378302 A1* | 12/2016 | Gilger | G06Q 10/067 |
| | | | 715/736 |
| 2017/0048598 A1 | 2/2017 | Foster | |
| 2017/0090441 A1* | 3/2017 | Schmitt | G05B 15/02 |
| 2017/0132567 A1 | 5/2017 | Glunz | |
| 2017/0132568 A1 | 5/2017 | Glunz | |
| 2017/0140485 A1 | 5/2017 | Balzs | |
| 2018/0365776 A1 | 12/2018 | Chan | |
| 2019/0347670 A1 | 11/2019 | Abramson | |
| 2020/0134560 A1 | 4/2020 | McLinden et al. | |
| 2020/0134745 A1 | 4/2020 | McLinden et al. | |
| 2020/0380080 A1 | 12/2020 | Glunz | |
| 2022/0113690 A1 | 4/2022 | Seifert et al. | |

OTHER PUBLICATIONS

Signal Boosters, "Building Materials that kill your Cell Reception", Mar. 5, 2020 (Year: 2020).*

Oza, Harnil, "A Guide to Implementing Offline Mode in your Mobile App", Oct. 13, 2020 (Year: 2020).*

Konstant Infosolutions, "Basics to Make your Mobile App Available in Offline Mode", Jan. 4, 2020 (Year: 2020).*

* cited by examiner

PROTOCOL STACK

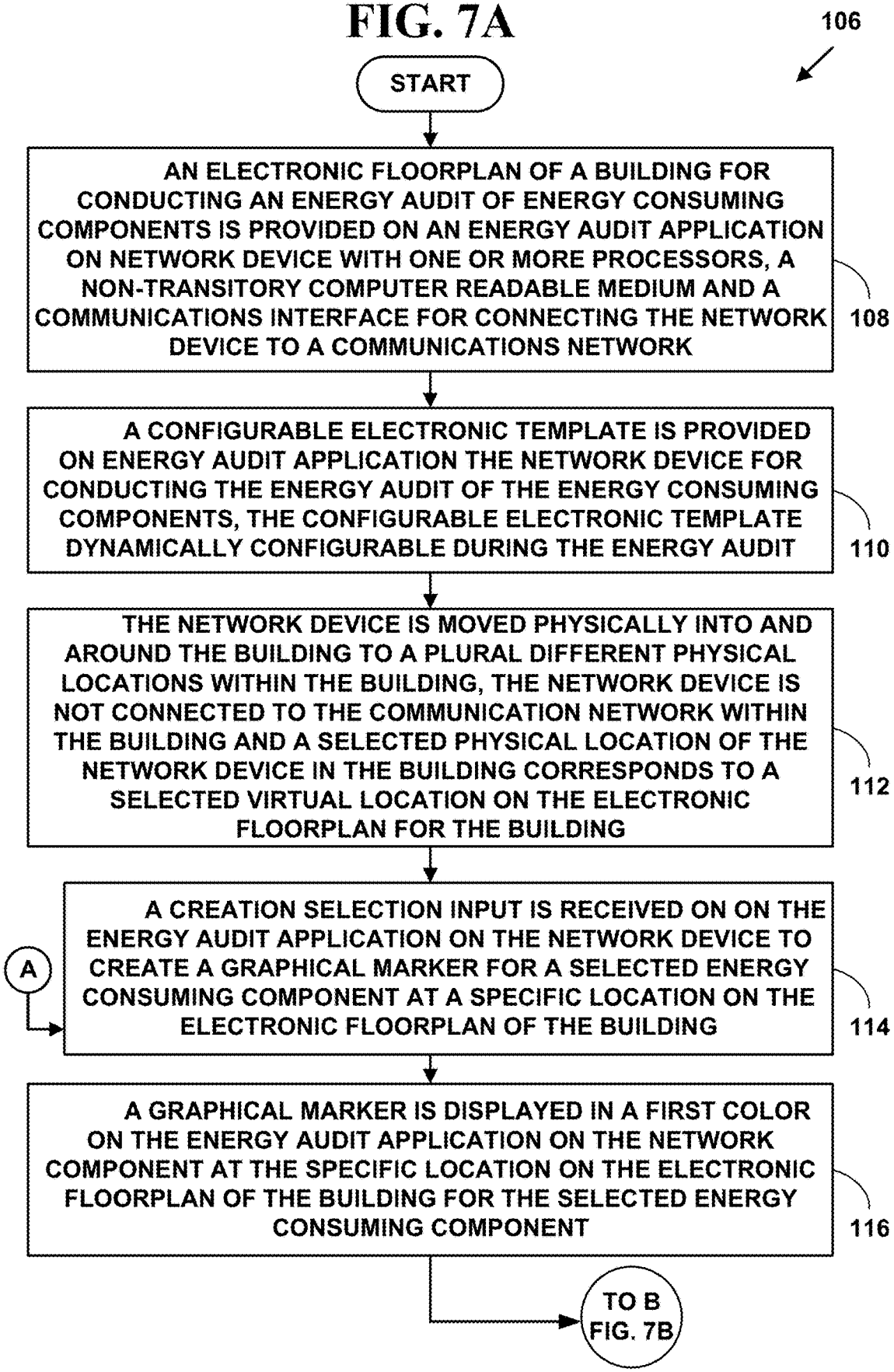

FIG. 7B (B)
↓

PLURAL COLLECTION SELECTION INPUTS ARE RECEIVED ON THE ENERGY AUDIT APPLICATION ON NETWORK DEVICE INCLUDING: (A) AUDIO INFORMATION FROM AN AUDIO COMPONENT ON THE NETWORK DEVICE (B) VISUAL INFORMATION FROM A CAMERA COMPONENT ON THE NETWORK DEVICE, AND (C) ELECTRONIC INFORMATION FROM AN ELECTRONIC KEYBOARD COMPONENT ON THE NETWORK DEVICE, THE AUDIO, VISUAL AND ELECTRONIC INFORMATION INCLUDING INFORMATION COLLECTED FOR THE SELECTED ENERGY CONSUMING COMPONENT AT THE SPECIFIC LOCATION ON THE ELECTRONIC FLOORPLAN OF THE BUILDING — 118

THE RECEIVED AUDIO, VISUAL AND ELECTRONIC INFORMATION IS STORED IN THE CONFIGURABLE ELECTRONIC TEMPLATE ON THE ENERGY AUDIT APPLICATION ON NETWORK DEVICE — 120

STEPS 114 THROUGH 120 ARE REPEATED FOR PLURAL OF OTHER SELECTED ENERGY CONSUMING COMPONENTS AT PLURAL OTHER SPECIFIC LOCATIONS ON THE ELECTRONIC FLOORPLAN OF THE BUILDING — 122

(TO A FIG. 7A)

AN ENERGY AUDIT SUMMARY REPORT IS CREATED ON THE ENERGY AUDIT APPLICATION ON THE NETWORK DEVICE WITH THE STORED AUDIO, VISUAL AND ELECTRONIC INFORMATION. THE ENERGY AUDIT SUMMARY REPORT IS DYNAMICALLY UPDATED ON THE ENERGY AUDIT APPLICATION ON THE NETWORK DEVICE AS ENERGY CONSUMING COMPONENTS ARE IDENTIFIED IN THE BUILDING — 124

(TO C FIG. 7C)

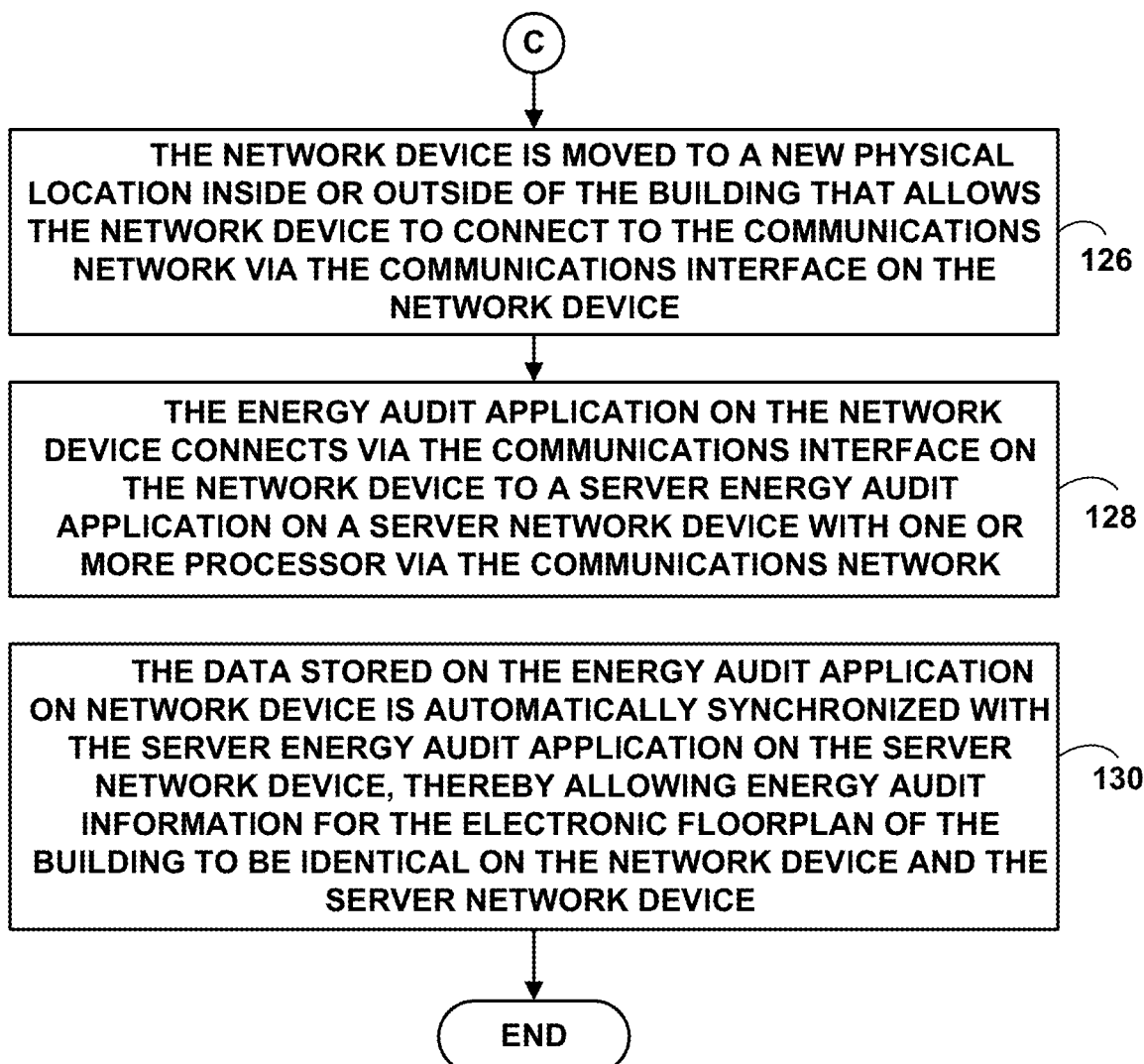

METHOD AND SYSTEM FOR PROVIDING ENERGY AUDITS

CROSS REFERENCES TO RELATED APPLICATIONS

Not Applicable.

FIELD OF INVENTION

This invention relates to energy consuming and energy producing devices. More specifically, it relates to a method and system for providing energy audits including installation, verification and inspection of energy consuming devices and energy producing devices.

BACKGROUND OF THE INVENTION

In commercial, industrial, and governmental buildings, including buildings in the municipal, university, schools and hospital (MUSH) sectors, there are a large number of energy consuming devices such as lighting, controls, heating, ventilation, air conditioning, etc. These energy consuming devices often include devices manufactured by multiple different companies and include devices installed and replaced during many different time periods.

A commercial or industrial building (e.g., office, factory, etc.) typically includes a variety of energy consuming devices that may be using older technologies, be inefficient, include devices that are no longer available, etc. For example, a building may include a mix of old inefficient incandescent lighting or florescent lighting and more efficient Light Emitting Diode (LED) lighting. The building may include transformers or starters for their florescent lighting that are energy inefficient or are no longer manufactured and available for purchase.

A commercial or industrial building may also include, or be associated with energy producing devices, such as solar panels, wind turbines, hydroelectric generators, biomass generators or nuclear reactors. These energy producing devices also include components manufactured by multiple different companies and include components installed and replaced during many different time periods.

There are many problems associated with such a mix of energy consuming and energy producing components. One problem is that companies performing energy consumption audits and retrofit projects on commercial and industrial buildings must first gather the "as-is" environment of a building to create an existing energy footprint, and to understand critical space details required to estimate and carryout an energy audit or energy upgrade project.

To complete an energy audit or energy retrofit project, a building engineer must physically walk through the building collecting counts, space details and pictures of energy consuming devices and energy produces devices that reside in the building. This data collection process is referred to as an Energy "Audit," "Survey," "Walk-through," "Assessment," or "Pre-view."

Historically, this data collection process has been done on paper and then transcribed into a spreadsheet, a process that is time-consuming and error prone.

Another problem is that commercial, industrial and Municipal, University, School and Hospital (MUSH) market buildings are large and include a huge number of energy consumption or energy producing components. A commercial building may include many different floors and an industrial building may include many hundreds of thousands of square feet. Any energy audit takes a large amount of time is subject to many different types of collection errors.

Another problem is that when building engineers conduct an energy audit, they use their own data collection process and notations. This introduces inconsistencies in the data collection process and is less application than if a standard data collection process with standard terminology is used Another problem is the building engineer may not be able to read his or her handwritten notes after an energy audit.

Another problem is that building engineers may take multiple individual pictures of energy consumption components or energy producing components during a data collection process. Managing such multiple individual pictures is difficult.

Another problem is that in many commercial and industrial buildings electronic devices cannot connect to communications networks, such as the Internet, a telecommunications network, a WiFi network, etc. because such buildings typically include concrete, steel and other building materials that block receiving electronic signals from such communications networks. Thus, a building engineer who is conducting a data collection process for an energy audit or energy retrofit is not able to use any electronic device such as a mobile phone, tablet, etc. to complete the data collection process being online and connected to a communications network, cloud communications network, etc.

Another problem is that if an electronic device cannot connect to communications networks, such as the Internet, a telecommunications network, a WiFi network, etc. because such buildings typically include concrete, steel and other building materials that block receiving electronic signals from such communications networks, a device such as a smart phone, tablet, etc. will continuously try to connect to the communications network and quickly drain its battery and then can no longer be used within the building.

Another problems is that when data collection for an energy audit or energy retrofit is being conducted, exact locations of the energy consumption components or energy producing components within the buildings cannot be determined or properly recorded because drawings for the building are no longer available, are not up to date or are not available electronically.

Another problem is that exact or estimated measurements of the energy consumption components or energy producing components because documentation for the components may be have lost or no longer be available to the building engineer because the component.

Another problems is that when data collection for an energy audit or energy retrofit is being conducted the data collection is done in an ad-hoc manner and the data collected is not consistent and may not be reproducible.

Another problem is that when data collection for an energy audit or energy retrofit is being conducted, the data collection information is not synchronized among devices or parties and is therefore prone to errors.

Thus, it is desirable to solve some of the interoperability problems associated with conducting audits and retrofits of energy consuming and energy producing devices in a commercial or industrial building.

SUMMARY OF THE INVENTION

In accordance with preferred embodiments of the present invention, some of the problems associated with conducting audits and retrofits of energy consuming and energy producing components in commercial, industrial or MUSH market buildings are overcome. A method and system for providing energy audits including installation, verification and inspection of energy consuming devices and energy producing components is presented.

The method and system allows an energy audit to be conducted offline on an energy audit application on a network device to capture information related to energy consuming components (e.g., lighting, heating, ventilation, air condition, etc.) and energy producing components (e.g., solar, wind, water, etc.) and automatically synchronized to a server network device when the network device is able to connect to a communications network and go on-line. Energy audit templates are provided and can be customized to ensure all energy consuming components and energy producing components are fully defined and consistently identified on an electronic floorplan for a commercial or industrial building.

The foregoing and other features and advantages of preferred embodiments of the present invention will be more readily apparent from the following detailed description. The detailed description proceeds with references to the accompanying drawings.

BRIEF DESCRIPTION OF THE DRAWINGS

Preferred embodiments of the present invention are described with reference to the following drawings, wherein:

FIGS. 7A, 7B and 7C are a flow diagram illustrating a method for energy audit installation, tracking, inspection and verification services;

DETAILED DESCRIPTION OF THE INVENTION

Exemplary Electronic Message Processing and Display System

Figure 1:
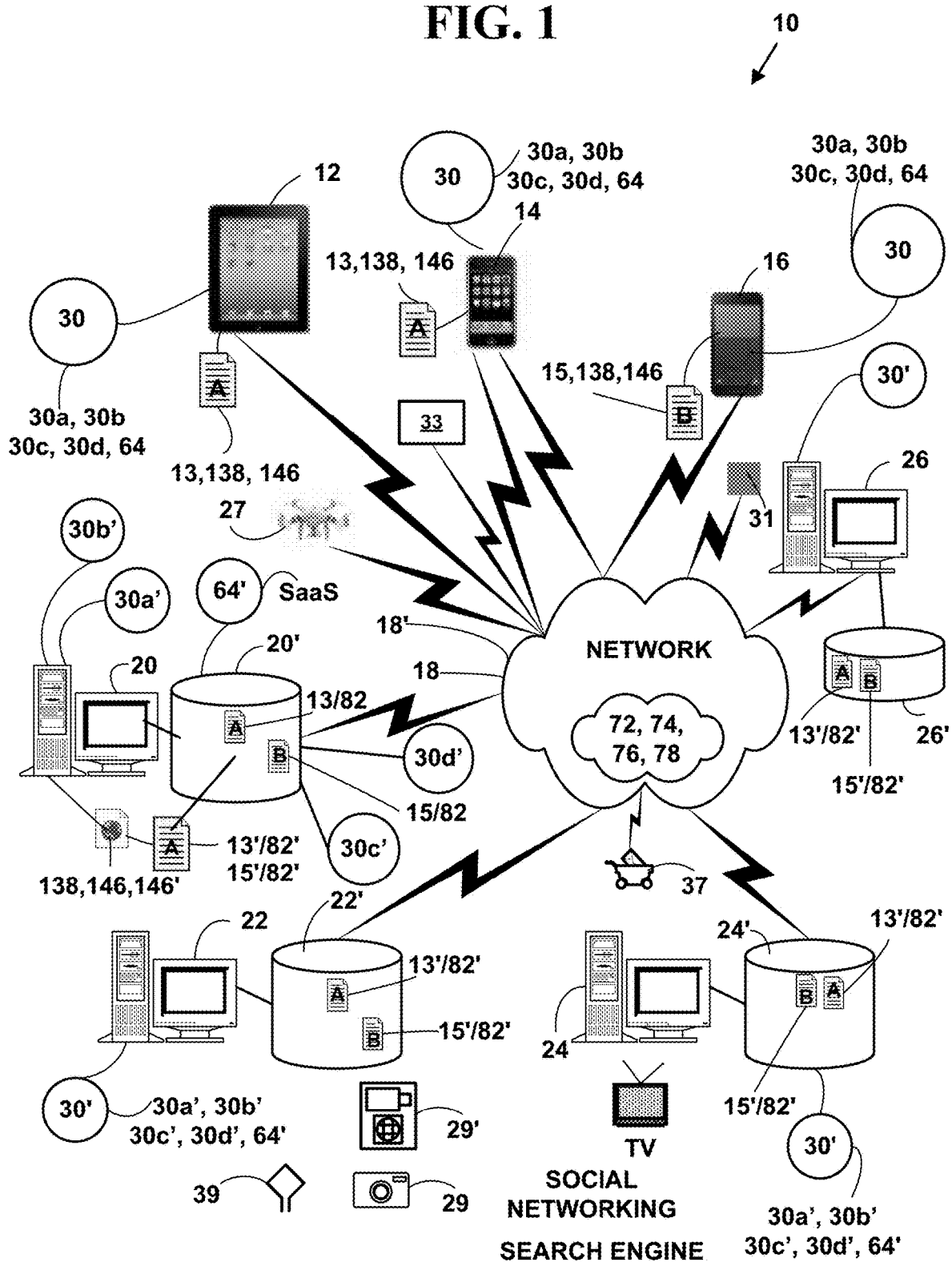
FIG. 1 is a block diagram illustrating an exemplary energy audit processing and display system.

FIG. 1 is a block diagram illustrating an exemplary electronic energy audit processing and display system 10. The exemplary electronic system 10 includes, but is not limited to, one or more target network devices 12, 14, 16, etc. each with one or more processors and each with a non-transitory computer readable medium.

The one or more target network devices 12, 14, 16 (illustrated in FIG. 1 only as a tablet and two smart phones for simplicity) include, but are not limited to, desktop and laptop computers, electronic tablets, surface computers (i.e., a computer that interacts with a user through the surface of an ordinary object, rather than through a monitor, keyboard, mouse, or other physical hardware, etc.) mobile phones, non-mobile phones with displays, three-dimensional (3D) printers, smart phones, Internet phones, Internet appliances, personal digital/data assistants (PDA), portable, handheld and desktop video game devices, unmanned aerial vehicles (UAVs) 27 with camera components, cameras 29, 360-degree cameras 29', smart speakers 31, Internet of Things (IoT) devices 33, Light Detection and Ranging (LIDR) devices 35, driverless vehicles 37 with camera components, cable television (CATV), satellite television (SATV) and Internet television set-top boxes, digital televisions including high definition television (HDTV), three-dimensional (3DTV) televisions, wearable network devices 98-104 (FIG. 6), and/or other types of network devices.

A "smart phone" is a mobile phone 14 that offers more advanced computing ability and connectivity than a contemporary basic feature phone. Smart phones and feature phones may be thought of as handheld computers integrated with a mobile telephone, but while most feature phones are able to run applications based on platforms such as JAVA ME, a smart phone usually allows the user to install and run more advanced applications. Smart phones and/or tablet computers run complete operating system software providing a platform for application developers.

The tablet computers 12 include, but are not limited to, tablet computers such as the IPAD, by APPLE, Inc., the HP Tablet, by HEWLETT PACKARD, Inc., the PLAYBOOK, by RIM, Inc., the TABLET, by SONY, Inc., MICROSOFT SURFACE, etc.

An unmanned aerial vehicle (UAV) 27, commonly known as a "drone" and also referred to as a "Remotely Piloted Aircraft (RPA)" by the International Civil Aviation Organization (ICAO), is an aircraft without a human pilot aboard. There are different kind of drones 123 including: (1) UAS (Unmanned Air System); (2) UAV (Unmanned Aerial Vehicle); (3) RPAS (Remote Piloted Aircraft Systems) and (4) Model Aircraft. Its flight is controlled either autonomously by onboard computers or by the remote control of a pilot on the ground or in another vehicle. The typical launch and recovery method of an unmanned aircraft is by the function of an automatic system or an external operator on the ground. Historically, UAVs 27 were simple remotely piloted aircraft, but autonomous control is increasingly being employed.

The use of UAVs 27 are characterized by altitudes of flights. The following types of UAVs 27 fly at different altitudes, broadly characterized as: (1) Very high altitude (VHA): above 45,000 feet (more than 12 km); (2) High altitude (HA): from 20,000 to 45,000 feet (6 to 12 km); (3) Medium altitude (MA): from 10 to 20,000 feet (3 to 6 km); or (4) Low altitude (LA): between a few hundred and up to 10,000 feet (1 to 3 km).

The specific needs of UAV 27 include required UAV 123 capabilities to allow them to fly in "non-segregated" air-traffic controlled airspace. The requirements placed on mobile links to and from a UAV 27 are required in terms of aeronautical safety due to the fact that these vehicles are unmanned. An air-traffic control (ATC) link includes full automation of communications between on-board and ground systems. A remote pilot (RP) link places additional and more strenuous constraints on the radio communication bearer(s) and systems used in, not necessarily significant as regards the amount of volume of data to be exchanged, in as much as UAV 27 generally possess or will possess their own computerized autonomous flight management system, limiting the remote pilot (RP) interventions to that of supervising and/or re-establishing flight procedures or choosing the most appropriate one, should any contingency arise.

The UAV 27 communicates on Aeronautical Mobile Service (AMS) wireless frequency including, but not limited to:

(a) 4400-4940 MHz; (b) 5030 (or 5010)-5090 MHz, (MLS "core" band; (c) 5090-5150 MHz ("MLS" extension band); (d) 5150-5250 MHz; (e) 5925-6700 MHz; (1) 22.5-23.6 GHz; (g) 24.75-25.5 GHz; or (h) 27-27.5 GHz.

Most UAVs 27 have camera components, microphones and other audiovisual equipment that are used to view and collect information objects of interest from the air. The audiovisual signals are typically sent from the UAV's 27 to a remote control center for viewing by an operator.

A 360-degree camera 29' also called an omnidirectional camera, is a camera having a field of view that covers approximately the entire sphere or at least a full circle in the horizontal plane. 360-cameras 29' are use in areas where large visual field coverage is needed, such as in panoramic photography.

A smart speaker 31 is a type of wireless speaker and voice command device with an integrated virtual assistant that offers interactive actions and hands-free activation with the help of one "hot word" (or several "hot words"). Some smart speakers can also act as a smart device that utilizes Wi-Fi, Bluetooth and other wireless protocol standards to extend usage beyond audio playback, such as to control home automation devices. This can include, but is not limited to, features such as compatibility across a number of services and platforms, peer-to-peer connection through mesh networking, virtual assistants, and others. Each can have its own designated interface and features in-house, usually launched or controlled via application or home automation software. Some smart speakers also include a screen to show the user a visual response.

The IoT network devices 33, include but are not limited to, cameras 29, 360-degree cameras 29', LIDAR devices, 35, security cameras, doorbells with real-time video cameras, baby monitors, televisions, set-top boxes, lighting, heating (e.g., smart thermostats, etc.), ventilation, air conditioning (HVAC) systems, and appliances such as washers, dryers, robotic vacuums, air purifiers, ovens, refrigerators, freezers, toys, game platform controllers, game platform attachments (e.g., guns, googles, sports equipment, etc.), and/or other IoT network devices.

The LIDAR devices 35, include but are not limited to, standalone LIDAR devices and/or LIDAR components with LIDAR applications used on a smart phone 14, electronic tablets 12, surface computers, etc. LIDAR is a method for measuring distances by illuminating a target with laser light and measuring a reflection with a sensor. Differences in laser return times and wavelengths are then used to make digital 3-D representations of a target.

A driverless vehicle 37, or self-driving car, also known as an autonomous vehicle, connected and autonomous vehicle, driverless car, robo-car, or robotic car, is a vehicle that is capable of sensing its environment and moving safely with little or no human input.

The target network devices 12, 14, 16, 27, 29, 27, 29, 31, 33, 35, 37, 98-104 are in communications with a cloud communications network 18 or a non-cloud computing network 18' via one or more wired and/or wireless communications interfaces. The cloud communications network 18, is also called a "cloud computing network" herein and the terms may be used interchangeably.

The plural target network devices 12, 14, 16, 27, 29, 27, 29, 31, 33, 35, 37, 98-104 make requests for electronic content 13, 15, 13'/82, 15'/82, 138, 146, 146' via the cloud communications network 18 or non-cloud communications network 18'

The cloud communications network 18 and non-cloud communications network 18' includes, but is not limited to, communications over a wire connected to the target network devices, wireless communications, and other types of communications using one or more communications and/or networking protocols.

Plural server network devices 20, 22, 24, 26 (only four of which are illustrated) each with one or more processors and a non-transitory computer readable medium include one or more associated databases 20', 22', 24', 26'. The plural network devices 20, 22, 24, 26 are in communications with the one or more target devices 12, 14, 16, 27, 29, 27, 29, 31, 33, 35, 37, 98-104 via the cloud communications network 18 and non-cloud communications network 18'.

Plural server network devices 20, 22, 24, 26 (only four of which are illustrated) are physically located on one or more public networks 76 (See FIG. 4), private networks 72, community networks 74 and/or hybrid networks 78 comprising the cloud network 18.

One or more server network devices (e.g., 20, 22, 24, 26, etc.) store portions 13', 15' of the electronic content 13, 15, 138, 146, 146' (e.g., energy audit data, etc.) as cloud storage objects 82 (FIG. 5) as is described herein.

The plural server network devices 20, 22, 24 26, may be connected to, but are not limited to, World Wide Web servers, Internet servers, search engine servers, vertical search engine servers, social networking site servers, file servers, other types of electronic information servers, and other types of server network devices (e.g., edge servers, firewalls, routers, gateways, etc.).

The plural server network devices 20, 22, 24, 26 also include, but are not limited to, network servers used for cloud computing providers, etc.

The cloud communications network 18 and non-cloud communications network 18' includes, but is not limited to, a wired and/or wireless communications network comprising one or more portions of: the Internet, an intranet, a Local Area Network (LAN), a wireless LAN (WiLAN), a Wide Area Network (WAN), a Metropolitan Area Network (MAN), a Public Switched Telephone Network (PSTN), a Wireless Personal Area Network (WPAN) and other types of wired and/or wireless communications networks 18.

The cloud communications network 18 and non-cloud communications network 18' includes one or more gateways, routers, bridges and/or switches. A gateway connects computer networks using different network protocols and/or operating at different transmission capacities. A router receives transmitted messages and forwards them to their correct destinations over the most efficient available route. A bridge is a device that connects networks using the same communications protocols so that information can be passed from one network device to another. A switch is a device that filters and forwards packets between network segments based on some pre-determined sequence (e.g., timing, sequence number, etc.).

An operating environment for the network devices of the exemplary electronic information display system 10 include a processing system with one or more high speed Central Processing Unit(s) (CPU), processors, one or more memories and/or other types of non-transitory computer readable mediums. In accordance with the practices of persons skilled in the art of computer programming, the present invention is described below with reference to acts and symbolic representations of operations or instructions that are performed by the processing system, unless indicated otherwise. Such acts and operations or instructions are referred to as being "computer-executed," "CPU-executed," or "processor-executed."

It will be appreciated that acts and symbolically represented operations or instructions include the manipulation of electrical information by the CPU or processor. An electrical system represents data bits which cause a resulting transformation or reduction of the electrical information or biological information, and the maintenance of data bits at memory locations in a memory system to thereby reconfigure or otherwise alter the CPU's or processor's operation, as well as other processing of information. The memory locations where data bits are maintained are physical locations that have particular electrical, magnetic, optical, or organic properties corresponding to the data bits.

The data bits may also be maintained on a non-transitory computer readable medium including magnetic disks, optical disks, organic memory, and any other volatile (e.g., Random Access Memory (RAM)) or non-volatile (e.g., Read-Only Memory (ROM), flash memory, etc.) mass storage system readable by the CPU. The non-transitory computer readable medium includes cooperating or interconnected computer readable medium, which exist exclusively on the processing system or can be distributed among multiple interconnected processing systems that may be local or remote to the processing system.

Exemplary Electronic Content Display System

Figure 2:
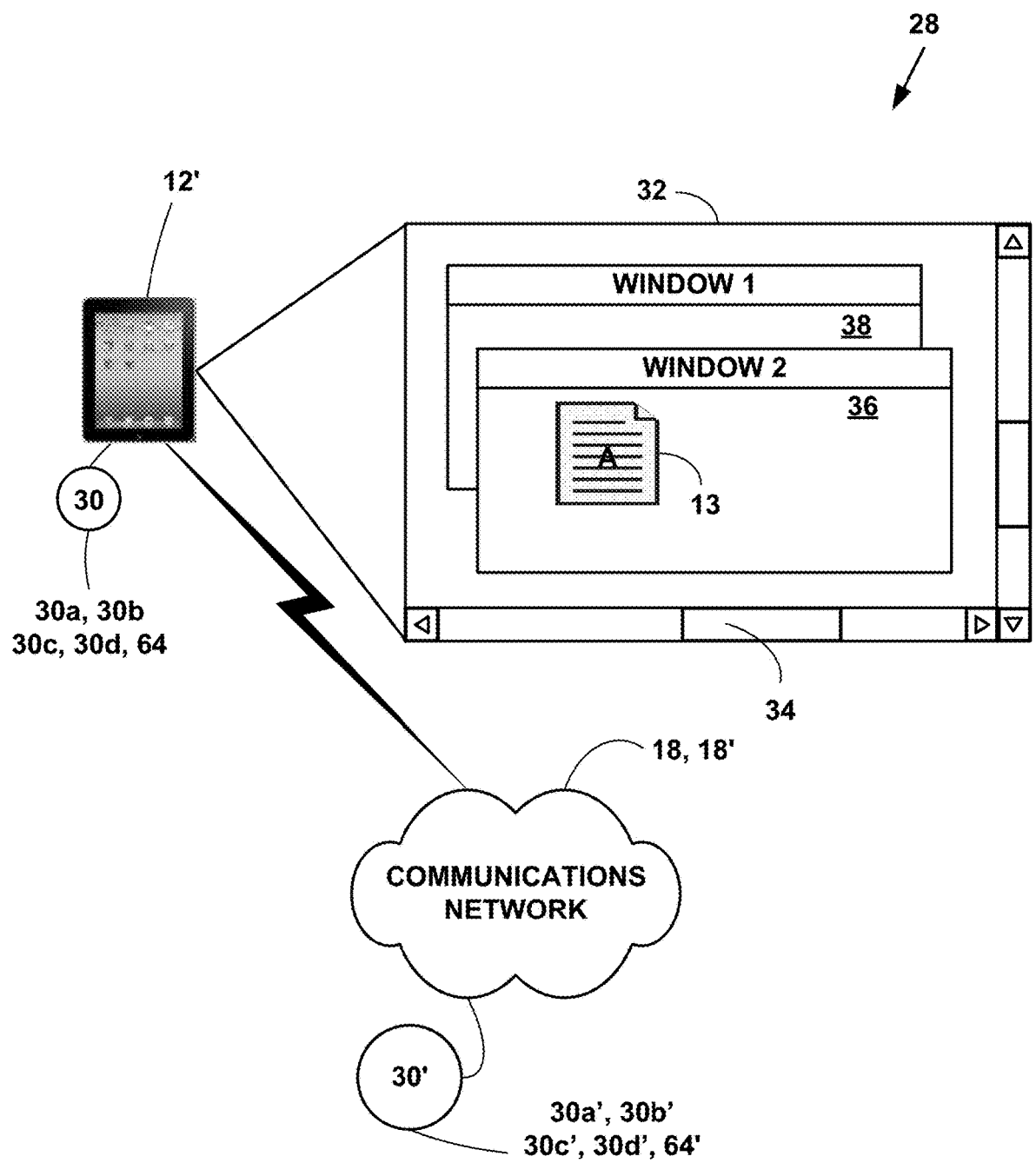
FIG. 2 is a block diagram illustrating an exemplary energy audit display system.

FIG. 2 is a block diagram illustrating an exemplary electronic energy audit information display system 28. The exemplary electronic message information display system 12' includes, but is not limited to a target network device (e.g., 12, etc.) with an application 30 and a display component 32. The application 30 presents a graphical user interface (GUI) 34 on the display 32 component. The GUI 32 presents a multi-window 36, 38, etc. (only two of which are illustrated) interface to a user.

In one embodiment of the invention, the application 30 is a software application. However, the present invention is not limited to this embodiment and the application 30 can be hardware, firmware, hardware and/or any combination thereof. In one embodiment, the application 30 includes a mobile application for a smart phone, electronic tablet and/or other network device. In one embodiment, the application 30 includes web-browser based application. In one embodiment, the application 30 includes a web-chat client application. In another embodiment, the application 30a, 30b, 30c, 30d includes a cloud application used on a cloud communications network 18. However, the present invention is not limited these embodiments and other embodiments can be used to practice the invention In another embodiment, a portion of the application 30 is executing on the target network devices 12, 14, 16, 27, 29, 27, 29, 31, 33, 35, 37, 98-104 and another portion of the application 30a, 30b, 30c, 30d is executing on the server network devices 20, 22, 24, 26. The applications also include one or more library applications. However, the present invention is not limited these embodiments and other embodiments can be used to practice the invention.

Exemplary Networking Protocol Stack

Figure 3:
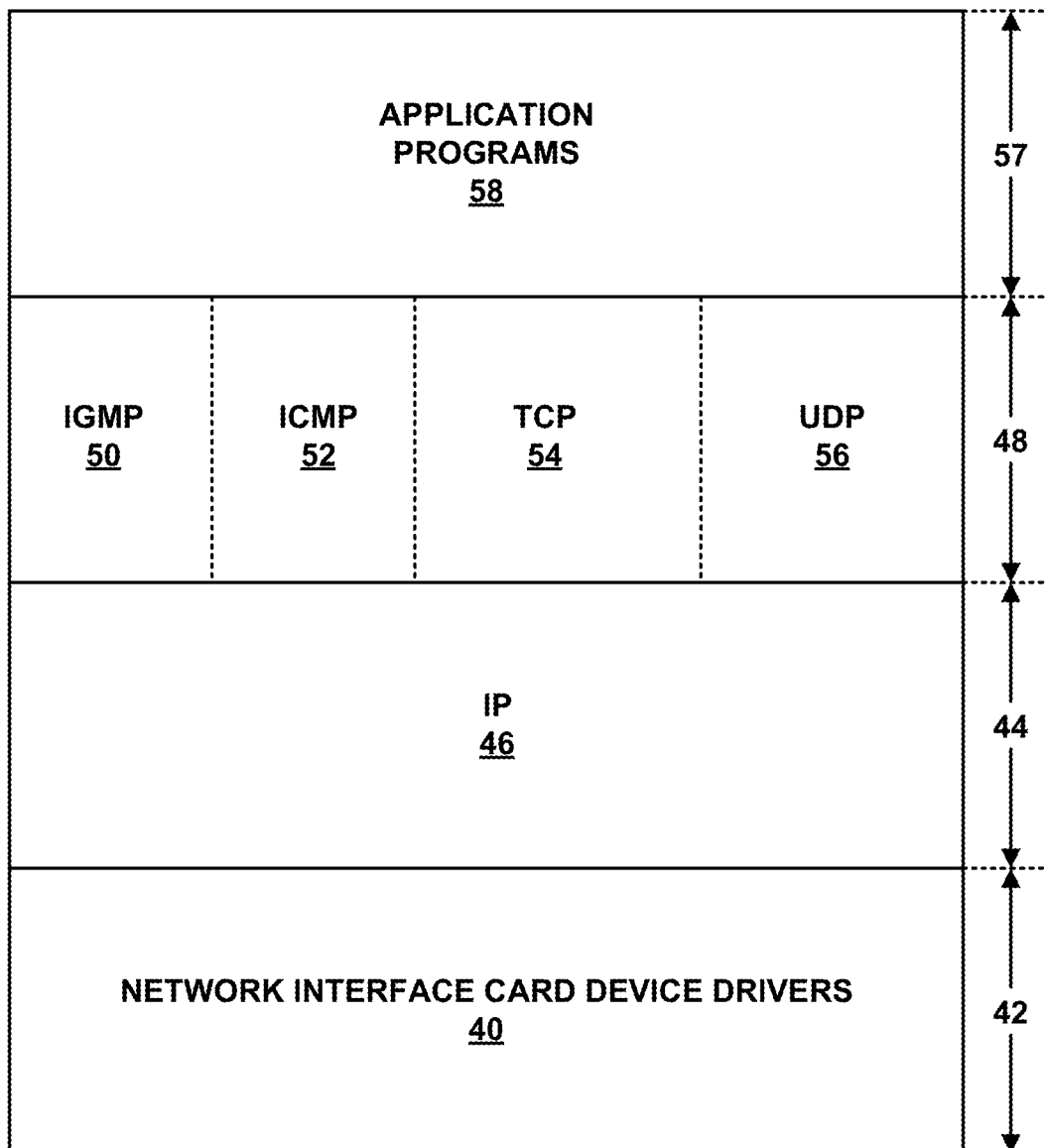
FIG. 3 is a block diagram illustrating an exemplary networking protocol stack.

FIG. 3 a block diagram illustrating a layered protocol stack 38 for network devices in the electronic message information display system 10. The layered protocol stack 38 is described with respect to Internet Protocol (IP) suites comprising in general from lowest-to-highest, a link 42, network 44, transport 48 and application 56 layers. However, more or fewer layers could also be used, and different layer designations could also be used for the layers in the protocol stack 38 (e.g., layering based on the Open Systems Interconnection (OSI) model including from lowest-to-highest, a physical, data-link, network, transport, session, presentation and application layer.).

The network devices 12, 14, 16, 20, 22, 24, 26, 27, 29, 27, 29, 31, 33, 35, 37, 98-104 are connected to the communication network 18 with Network Interface Card (NIC) cards including device drivers 40 in a link layer 42 for the actual hardware connecting the network devices 12, 14, 16, 20, 22, 24, 26, 27, 29, 27, 29, 31, 33, 35, 37, 98-104 to the cloud communications network 18. For example, the NIC device drivers 40 may include a serial port device driver, a digital subscriber line (DSL) device driver, an Ethernet device driver, a wireless device driver, a wired device driver, etc. The device drivers interface with the actual hardware being used to connect the network devices to the cloud communications network 18. The NIC cards have a medium access control (MAC) address that is unique to each NIC and unique across the whole cloud network 18. The Medium Access Control (MAC) protocol is used to provide a data link layer of an Ethernet LAN system and for other network systems.

Above the link layer 42 is a network layer 44 (also called the Internet Layer for Internet Protocol (IP) suites). The network layer 44 includes, but is not limited to, an IP layer 46.

IP 46 is an addressing protocol designed to route traffic within a network or between networks. However, more fewer or other protocols can also be used in the network layer 44, and the present invention is not limited to IP 46. For more information on IP 46 see IETF RFC-791, incorporated herein by reference.

Above network layer 44 is a transport layer 48. The transport layer 48 includes, but is not limited to, an optional Internet Group Management Protocol (IGMP) layer 50, a Internet Control Message Protocol (ICMP) layer 52, a Transmission Control Protocol (TCP) layer 52 and a User Datagram Protocol (UDP) layer 54. However, more, fewer or other protocols could also be used in the transport layer 48.

Optional IGMP layer 50, hereinafter IGMP 50, is responsible for multicasting. For more information on IGMP 50 see RFC-1112, incorporated herein by reference. ICMP layer 52, hereinafter ICMP 52 is used for IP 46 control. The main functions of ICMP 52 include error reporting, reachability testing (e.g., pinging, etc.), route-change notification, performance, subnet addressing and other maintenance. For more information on ICMP 52 see RFC-792, incorporated herein by reference. Both IGMP 50 and ICMP 52 are not required in the protocol stack 38. ICMP 52 can be used alone without optional IGMP layer 50.

TCP layer 54, hereinafter TCP 54, provides a connection-oriented, end-to-end reliable protocol designed to fit into a layered hierarchy of protocols which support multi-network applications. TCP 54 provides for reliable inter-process communication between pairs of processes in network devices attached to distinct but interconnected networks. For more information on TCP 54 see RFC-793, incorporated herein by reference.

UDP layer 56, hereinafter UDP 56, provides a connectionless mode of communications with datagrams in an interconnected set of computer networks. UDP 56 provides a transaction oriented datagram protocol, where delivery and duplicate packet protection are not guaranteed. For more information on UDP 56 see RFC-768, incorporated herein by reference. Both TCP 54 and UDP 56 are not required in protocol stack 38. Either TCP 54 or UDP 56 can be used without the other.

Above transport layer 48 is an application layer 57 where application programs 58 (e.g., 30, 30a, 30b, 30c, 30d, etc.) to carry out desired functionality for a network device reside. For example, the application programs 58 for the client network devices 12, 14, 16, 27, 29, 27, 29, 31, 33, 35, 37, 98-104 may include web-browsers or other application programs, application program 30, while application programs for the server network devices 20, 22, 24, 26 may include other application programs (e.g., 30a, 30b, 30c, 30d, etc.).

In one embodiment, the application layer 57 includes Java, Javascript and/or JavaScript Object Notation (JSON), etc. JSON is a lightweight data-interchange format that is easy for humans to read and write.

In one embodiment, application program 30 includes an Energy Audit, application 30a, an Energy Audit offline functionality application 30b, an Artificial Intelligence (AI) application 30c and/or other application 30d. The AI application 30c is used with and/or without Big Data. However, the present invention is not limited to such an embodiment and more, fewer and/or other applications can be used to practice the invention.

However, the protocol stack 38 is not limited to the protocol layers illustrated and more, fewer or other layers and protocols can also be used in protocol stack 38. In addition, other protocols from the Internet Protocol suites (e.g., Simple Mail Transfer Protocol, (SMTP), Hyper Text Transfer Protocol (HTTP), File Transfer Protocol (FTP), Dynamic Host Configuration Protocol (DHCP), DNS, etc.) and/or other protocols from other protocol suites may also be used in protocol stack 38.

In addition, markup languages such as HyperText Markup Language (HTML), EXtensible Markup Language (XML) and others are used.

HyperText Markup Language (HTML) is a markup language for creating web pages and other information that can be displayed in a web browser.

HTML is written in the form of HTML elements consisting of tags enclosed in angle brackets within the web page content. HTML tags most commonly come in pairs although some tags represent empty elements and so are unpaired. The first tag in a pair is the start tag, and the second tag is the end tag (they are also called opening tags and closing tags). In between these tags web designers can add text, further tags, comments and other types of text-based content.

The purpose of a web browser is to read HTML documents and compose them into visible or audible web pages. The browser does not display the HTML tags, but uses the tags to interpret the content of the page.

HTML elements form the building blocks of all websites. HTML allows images and objects to be embedded and can be used to create interactive forms. It provides a means to create structured documents by denoting structural semantics for text such as headings, paragraphs, lists, links, quotes and other items. It can embed scripts written in languages such as JavaScript which affect the behavior of HTML web pages.

EXtensible Markup Language (XML) is another markup language that defines a set of rules for encoding documents in a format that is both human-readable and machine-readable. It is defined in the XML 1.0 Specification produced by the W3C, the contents of which are incorporated by reference and several other related specifications, all free open standards.

XML a textual data format with strong support via Unicode for the languages of the world. Although the design of XML focuses on documents, it is widely used for the representation of arbitrary data structures, for example in web services. The oldest schema language for XML is the Document Type Definition (DTD). DTDs within XML documents define entities, which are arbitrary fragments of text and/or markup tags that the XML processor inserts in the DTD itself and in the XML document wherever they are referenced, like character escapes.

Preferred embodiments of the present invention include network devices and wired and wireless interfaces that are compliant with all or part of standards proposed by the Institute of Electrical and Electronic Engineers (IEEE), International Telecommunications Union-Telecommunication Standardization Sector (ITU), European Telecommunications Standards Institute (ETSI), Internet Engineering Task Force (IETF), U.S. National Institute of Security Technology (NIST), American National Standard Institute (ANSI), Wireless Application Protocol (WAP) Forum, Bluetooth Forum, or the ADSL Forum, Java Forum, Javascript Forum, etc.

Wireless Interfaces

In one embodiment of the present invention, the wireless interfaces on network devices 12, 14, 16, 20, 22, 24, 26, 29, 27, 29, 31, 33, 35, 37, 98-104 include but are not limited to, IEEE 802.11a, 802.11b, 802.11g, 802.11n, 802.15.4 (ZigBee), "Wireless Fidelity" (Wi-Fi), "Worldwide Interoperability for Microwave Access" (WiMAX), ETSI High Performance Radio Metropolitan Area Network (HIPERMAN) or "RF Home" wireless interfaces. In another embodiment of the present invention, the wireless sensor device may include an integral or separate Bluetooth and/or infra data association (IrDA) module for wireless Bluetooth or wireless infrared communications. However, the present invention is not limited to such an embodiment and other 802.11xx and other types of wireless interfaces can also be used.

802.11b is a short-range wireless network standard. The IEEE 802.11b standard defines wireless interfaces that provide up to 11 Mbps wireless data transmission to and from wireless devices over short ranges. 802.11a is an extension of the 802.11b and can deliver speeds up to 54 M bps. 802.11g deliver speeds on par with 802.11a. However, other 802.11XX interfaces can also be used and the present invention is not limited to the 802.11 protocols defined. The IEEE 802.11a, 802.11b and 802.11g standards are incorporated herein by reference.

Wi-Fi is a type of 802.11xx interface, whether 802.11b, 802.11a, dual-band, etc. Wi-Fi devices include an RF interfaces such as 2.4 GHz for 802.11b or 802.11g and 5 GHz for 802.11a.

802.15.4 (Zigbee) is low data rate network standard used for mesh network devices such as sensors, interactive toys, smart badges, remote controls, and home automation. The 802.15.4 standard provides data rates of 250 kbps, 40 kbps, and 20 kbps., two addressing modes; 16-bit short and 64-bit IEEE addressing, support for critical latency devices, such as joysticks, Carrier Sense Multiple Access/Collision Avoidance, (CSMA-CA) channel access, automatic network establishment by a coordinator, a full handshake protocol for transfer reliability, power management to ensure low power consumption for multi-month to multi-year battery usage and up to 16 channels in the 2.4 GHz Industrial, Scientific and Medical (ISM) band (Worldwide), 10 channels in the 915 MHz (US) and one channel in the 868 MHz band (Europe). The IEEE 802.15.4-2003 standard is incorporated herein by reference.

WiMAX is an industry trade organization formed by leading communications component and equipment companies to promote and certify compatibility and interoperability of broadband wireless access equipment that conforms to the IEEE 802.16XX and ETSI HIPERMAN. HIPERMAN is the European standard for metropolitan area networks (MAN).

The IEEE The 802.16a and 802.16g standards are wireless MAN technology standard that provides a wireless alternative to cable, DSL and T1/E1 for last mile broadband access. It is also used as complimentary technology to connect IEEE 802.11XX hot spots to the Internet.

The IEEE 802.16a standard for 2-11 GHz is a wireless MAN technology that provides broadband wireless connectivity to fixed, portable and nomadic devices. It provides up to 50-kilometers of service area range, allows users to get broadband connectivity without needing direct line of sight with the base station, and provides total data rates of up to 280 Mbps per base station, which is enough bandwidth to simultaneously support hundreds of businesses with T1/E1-type connectivity and thousands of homes with DSL-type connectivity with a single base station. The IEEE 802.16g provides up to 100 Mbps.

The IEEE 802.16e standard is an extension to the approved IEEE 802.16/16a/16g standard. The purpose of 802.16e is to add limited mobility to the current standard which is designed for fixed operation.

The ESTI HIPERMAN standard is an interoperable broadband fixed wireless access standard for systems operating at radio frequencies between 2 GHz and 11 GHz.

The IEEE 802.16a, 802.16e and 802.16g standards are incorporated herein by reference. WiMAX can be used to provide a WLP.

The ETSI HIPERMAN standards TR 101 031, TR 101 475, TR 101 493-1 through TR 101 493-3, TR 101 761-1 through TR 101 761-4, TR 101 762, TR 101 763-1 through TR 101 763-3 and TR 101 957 are incorporated herein by reference. ETSI HIPERMAN can be used to provide a WLP.

In one embodiment, the plural server network devices 20, 22, 24, 26 include a connection to plural network interface cards (NICs) in a backplane connected to a communications bus. The NIC cards provide gigabit/second ($1 \times 10^9$ bits/second) communications speed of electronic information. This allows "scaling out" for fast electronic content retrieval. The NICs are connected to the plural server network devices 20, 22, 24, 26 and the cloud communications network 18. However, the present invention is not limited to the NICs described and other types of NICs in other configurations and connections with and/or without buses can also be used to practice the invention.

In one embodiment, of the invention, the wireless interfaces also include wireless personal area network (WPAN) interfaces. As is known in the art, a WPAN is a personal area network for interconnecting devices centered around an individual person's devices in which the connections are wireless. A WPAN interconnects all the ordinary computing and communicating devices that a person has on their desk (e.g. computer, etc.) or carry with them (e.g., PDA, mobile phone, smart phone, table computer two-way pager, etc.)

A key concept in WPAN technology is known as "plugging in." In the ideal scenario, when any two WPAN-equipped devices come into close proximity (within several meters and/or feet of each other) or within a few miles and/or kilometers of a central server (not illustrated), they can communicate via wireless communications as if connected by a cable. WPAN devices can also lock out other devices selectively, preventing needless interference or unauthorized access to secure information. Zigbee is one wireless protocol used on WPAN networks such as cloud communications network 18 or non-cloud communications network 18'.

The one or more target network devices 12, 14, 16, 20, 22, 24, 26, 27, 29, 27, 29, 31, 33, 35, 37, 98-104 and one or more server network devices 20, 22, 24, 26 communicate with each other and other network devices with near field communications (NFC) and/or machine-to-machine (M2M) communications.

"Near field communication (NFC)" is a set of standards for smartphones and similar network devices to establish radio communication with each other by touching them together or bringing them into close proximity, usually no more than a few centimeters. Present applications include contactless transactions, data exchange, and simplified setup of more complex communications such as Wi-Fi. Communication is also possible between an NFC device and an unpowered NFC chip, called a "tag" including radio frequency identifier (RFID) tags 99 and/or sensor.

NFC standards cover communications protocols and data exchange formats, and are based on existing radio-frequency identification (RFID) standards including ISO/IEC 14443 and FeliCa. These standards include ISO/IEC 1809 and those defined by the NFC Forum, all of which are incorporated by reference.

An "RFID tag" is an object that can be applied to or incorporated into a product, animal, or person for the purpose of identification and/or tracking using RF signals.

An "RFID sensor" is a device that measures a physical quantity and converts it into an RF signal which can be read by an observer or by an instrument (e.g., target network devices 12, 14, 16, 20, 22, 24, 26, 27, 29, 27, 29, 31, 33, 35, 37, 98-104, server network devices 20, 22, 24, 26, etc.).

"Machine to machine (M2M)" refers to technologies that allow both wireless and wired systems to communicate with other devices of the same ability. M2M uses a device to capture an event (such as option purchase, etc.), which is relayed through a network (wireless, wired cloud, etc.) to an application (software program), that translates the captured event into meaningful information. Such communication was originally accomplished by having a remote network of machines relay information back to a central hub for analysis, which would then be rerouted into a system like a personal computer.

However, modern M2M communication has expanded beyond a one-to-one connection and changed into a system of networks that transmits data many-to-one and many-to-many to plural different types of devices and appliances. The expansion of IP networks across the world has made it far easier for M2M communication to take place and has lessened the amount of power and time necessary for information to be communicated between machines.

However, the present invention is not limited to such wireless interfaces and wireless networks and more, fewer and/or other wireless interfaces can be used to practice the invention.

Wired Interfaces

In one embodiment of the present invention, the wired interfaces include wired interfaces and corresponding networking protocols for wired connections to the Public Switched Telephone Network (PSTN) and/or a cable television network (CATV) and/or satellite television networks (SATV) and/or three-dimensional television (3DTV), including HDTV that connect the network devices 12, 14, 16, 20, 22, 24, 26, 27, 29, 27, 29, 31, 33, 35, 37, 98-104 via one or more twisted pairs of copper wires, digital subscriber lines (e.g. DSL, ADSL, VDSL, etc.) coaxial cable, fiber optic cable, other connection media or other connection interfaces. The PSTN is any public switched telephone network provided by AT&T, GTE, Sprint, MCI, SBC, Verizon and others. The CATV is any cable television network provided by the Comcast, Time Warner, etc. However, the present invention is not limited to such wired interfaces and more, fewer and/or other wired interfaces can be used to practice the invention.

Television Services

In one embodiment, the cloud applications 30, 30a, 30b, 30c, 30d provide cloud SaaS 64, 64' services and/or non-cloud application services from television services over the cloud communications network 18 or application services over the non-cloud communications network 18'. The television services include digital television services, including, but not limited to, cable television, satellite television, high-definition television, three-dimensional, televisions and other types of network devices.

However, the present invention is not limited to such television services and more, fewer and/or other television services can be used to practice the invention.

Internet Television Services

In one embodiment, the cloud applications 30, 30a, 30b, 30c, 30d provide cloud SaaS 64, 64' services and/or non-cloud application services from Internet television services over the cloud communications network 18 or non-cloud communications network 18' The television services include Internet television, Web-TV, and/or Internet Protocol Television (IPtv) and/or other broadcast television services.

"Internet television" allows users to choose a program or the television show they want to watch from an archive of programs or from a channel directory. The two forms of viewing Internet television are streaming content directly to a media player or simply downloading a program to a viewer's set-top box, game console, computer, or other network device.

"Web-TV" delivers digital content via broadband and mobile networks. The digital content is streamed to a viewer's set-top box, game console, computer, or other network device.

"Internet Protocol television (IPtv)" is a system through which Internet television services are delivered using the architecture and networking methods of the Internet Protocol Suite over a packet-switched network infrastructure, e.g., the Internet and broadband Internet access networks, instead of being delivered through traditional radio frequency broadcast, satellite signal, and cable television formats.

However, the present invention is not limited to such Internet Television services and more, fewer and/or other Internet Television services can be used to practice the invention.

General Search Engine Services

In one embodiment, the cloud applications 30, 30a, 30b, 30c, 30d provide cloud SaaS 64, 64' services and/or non-cloud application services from general search engine services. A search engine is designed to search for information on a cloud communications network 18 or non-cloud communications network 18' such as the Internet including World Wide Web servers, HTTP, FTP servers etc. The search results are generally presented in a list of electronic results. The information may consist of web pages, images, electronic information, multimedia information, and other types of files. Some search engines also mine data available in databases or open directories. Unlike web directories, which are maintained by human editors, search engines typically operate algorithmically and/or are a mixture of algorithmic and human input.

In one embodiment, the cloud applications 30, 30a, 30b, 30c, 30d provide cloud SaaS 64, 64' services and/or non-cloud application services from general search engine services. In another embodiment, the cloud applications 30, 30a, 30b, 30c, 30d provide general search engine services by interacting with one or more other public search engines (e.g., GOOGLE, BING, YAHOO, etc.) and/or private search engine services.

In another embodiment, the cloud applications 30, 30a, 30b, 30c, 30d provide cloud SaaS 64, 64' services and/or non-cloud application services from specialized search engine services, such as vertical search engine services by interacting with one or more other public vertical search engines (e.g., GALAXY.COM, etc.) and/or private search engine services.

However, the present invention is not limited to such general and/or vertical search engine services and more, fewer and/or other general search engine services can be used to practice the invention.

Social Networking Services

In one embodiment, the cloud applications 30, 30a, 30b, 30c, 30d provide cloud SaaS 64, 64' services and/or non-cloud application services from one more social networking services including to/from one or more social networking web-sites (e.g., FACEBOOK, YOUTUBE, TWITTER, INSTAGRAM, etc.). The social networking web-sites also include, but are not limited to, social couponing sites, dating web-sites, blogs, RSS feeds, and other types of information web-sites in which messages can be left or posted for a variety of social activities.

However, the present invention is not limited to the social networking services described and other public and private social networking services can also be used to practice the invention.

Security and Encryption

Network devices 12, 14, 16, 20, 22, 24, 26, 27, 29, 27, 29, 31, 33, 35, 37, 98-104 with wired and/or wireless interfaces of the present invention include one or more of the security and encryptions techniques discussed herein for secure communications on the cloud communications network 18 or non-cloud communications network 18'.

Application programs 58 (FIG. 2) include security and/or encryption application programs integral to and/or separate from the applications 30, 30a, 30b, 30c, 30d. Security and/or encryption programs may also exist in hardware components on the network devices (12, 14, 16, 20, 22, 24, 26, 27, 29, 27, 29, 31, 33, 35, 37, 98-104) described herein and/or exist in a combination of hardware, software and/or firmware.

Wireless Encryption Protocol (WEP) (also called "Wired Equivalent Privacy) is a security protocol for WiLANs defined in the IEEE 802.11b standard. WEP is cryptographic privacy algorithm, based on the Rivest Cipher 4 (RC4) encryption engine, used to provide confidentiality for 802.11b wireless data.

RC4 is cipher designed by RSA Data Security, Inc. of Bedford, Mass., which can accept encryption keys of arbitrary length, and is essentially a pseudo random number generator with an output of the generator being XORed with a data stream to produce encrypted data.

WEP is used at the two lowest layers of the OSI model, the physical layer and the data link layer, therefore, it typically does not offer end-to-end security. One another problem with WEP is that its encryption keys are static rather than dynamic. To update WEP encryption keys, an individual has to manually update a WEP key. WEP also typically uses 40-bit static keys for encryption and thus provides "weak encryption," making a WEP device a target of hackers.

The IEEE 802.11 Working Group is working on a security upgrade for the 802.11 standard called "802.11i." This supplemental draft standard is intended to improve WiLAN security. It describes the encrypted transmission of data between systems 802.11X WiLANs. It also defines new encryption key protocols including the Temporal Key Integrity Protocol (TKIP). The IEEE 802.11i draft standard, version 4, completed Jun. 6, 2003, is incorporated herein by reference.

The 802.11i standard is based on 802.1x port-based authentication for user and device authentication. The 802.11i standard includes two main developments: Wi-Fi Protected Access (WPA) and Robust Security Network (RSN).

WPA uses the same RC4 underlying encryption algorithm as WEP. However, WPA uses TKIP to improve security of keys used with WEP. WPA keys are derived and rotated more often than WEP keys and thus provide additional security. WPA also adds a message-integrity-check function to prevent packet forgeries.

RSN uses dynamic negotiation of authentication and selectable encryption algorithms between wireless access points and wireless devices. The authentication schemes proposed in the draft standard include Extensible Authentication Protocol (EAP). One proposed encryption algorithm is an Advanced Encryption Standard (AES) encryption algorithm.

Dynamic negotiation of authentication and encryption algorithms lets RSN evolve with the state of the art in security, adding algorithms to address new threats and continuing to provide the security necessary to protect information that WiLANs carry.

The NIST developed a new encryption standard, the Advanced Encryption Standard (AES) to keep government information secure. AES is intended to be a stronger, more efficient successor to Triple Data Encryption Standard (3DES).

DES is a popular symmetric-key encryption method developed in 1975 and standardized by ANSI in 1981 as ANSI X.3.92, the contents of which are incorporated herein by reference. As is known in the art, 3DES is the encrypt-decrypt-encrypt (EDE) mode of the DES cipher algorithm. 3DES is defined in the ANSI standard, ANSI X9.52-1998, the contents of which are incorporated herein by reference. DES modes of operation are used in conjunction with the NIST Federal Information Processing Standard (FIPS) for data encryption (FIPS 46-3, October 1999), the contents of which are incorporated herein by reference.

The NIST approved a FIPS for the AES, FIPS-197. This standard specified "Rijndael" encryption as a FIPS-approved symmetric encryption algorithm that may be used by U.S. Government organizations (and others) to protect sensitive information. The NIST FIPS-197 standard (AES FIPS PUB 197, November 2001) is incorporated herein by reference.

The NIST approved a FIPS for U.S. Federal Government requirements for information technology products for sensitive but unclassified (SBU) communications. The NIST FIPS Security Requirements for Cryptographic Modules (FIPS PUB 140-2, May 2001) is incorporated herein by reference.

RSA is a public key encryption system which can be used both for encrypting messages and making digital signatures. The letters RSA stand for the names of the inventors: Rivest, Shamir and Adleman. For more information on RSA, see U.S. Pat. No. 4,405,829, now expired and incorporated herein by reference.

"Hashing" is the transformation of a string of characters into a usually shorter fixed-length value or key that represents the original string. Hashing is used to index and retrieve items in a database because it is faster to find the item using the shorter hashed key than to find it using the original value. It is also used in many encryption algorithms.

Secure Hash Algorithm (SHA), is used for computing a secure condensed representation of a data message or a data file. When a message of any length $<2^{64}$ bits is input, the SHA-1 produces a 160-bit output called a "message digest." The message digest can then be input to other security techniques such as encryption, a Digital Signature Algorithm (DSA) and others which generates or verifies a security mechanism for the message. SHA-512 outputs a 512-bit message digest. The Secure Hash Standard, FIPS PUB 180-1, Apr. 17, 1995, is incorporated herein by reference.

Message Digest-5 (MD-5) takes as input a message of arbitrary length and produces as output a 128-bit "message digest" of the input. The MD5 algorithm is intended for digital signature applications, where a large file must be "compressed" in a secure manner before being encrypted with a private (secret) key under a public-key cryptosystem such as RSA. The IETF RFC-1321, entitled "The MD5 Message-Digest Algorithm" is incorporated here by reference.

Providing a way to check the integrity of information transmitted over or stored in an unreliable medium such as a wireless network is a prime necessity in the world of open computing and communications. Mechanisms that provide such integrity check based on a secret key are called "message authentication codes" (MAC). Typically, message authentication codes are used between two parties that share a secret key in order to validate information transmitted between these parties.

Keyed Hashing for Message Authentication Codes (HMAC), is a mechanism for message authentication using cryptographic hash functions. HMAC is used with any iterative cryptographic hash function, e.g., MD5, SHA-1, SHA-512, etc. in combination with a secret shared key. The cryptographic strength of HMAC depends on the properties of the underlying hash function. The IETF RFC-2101, entitled "HMAC: Keyed-Hashing for Message Authentication" is incorporated here by reference.

An Electronic Code Book (ECB) is a mode of operation for a "block cipher," with the characteristic that each possible block of plaintext has a defined corresponding cipher text value and vice versa. In other words, the same plaintext value will always result in the same cipher text value. Electronic Code Book is used when a volume of plaintext is separated into several blocks of data, each of which is then encrypted independently of other blocks. The Electronic Code Book has the ability to support a separate encryption key for each block type.

Diffie and Hellman (DH) describe several different group methods for two parties to agree upon a shared secret in such a way that the secret will be unavailable to eavesdroppers. This secret is then converted into various types of cryptographic keys. A large number of the variants of the DH method exist including ANSI X9.42. The IETF RFC-2631, entitled "Diffie-Hellman Key Agreement Method" is incorporated here by reference.

The HyperText Transport Protocol (HTTP) Secure (HTTPs), is a standard for encrypted communications on the World Wide Web. HTTPs is actually just HTTP over a Secure Sockets Layer (SSL). For more information on HTTP, see IETF RFC-2616 incorporated herein by reference.

The SSL protocol is a protocol layer which may be placed between a reliable connection-oriented network layer protocol (e.g. TCP/IP) and the application protocol layer (e.g. HTTP). SSL provides for secure communication between a source and destination by allowing mutual authentication, the use of digital signatures for integrity, and encryption for privacy.

The SSL protocol is designed to support a range of choices for specific security methods used for cryptography, message digests, and digital signatures. The security methods are negotiated between the source and destination at the start of establishing a protocol session. The SSL 2.0 protocol specification, by Kipp E. B. Hickman, 1995 is incorporated herein by reference. More information on SSL is available at the domain name See "netscape.com/eng/security/SSL_2.html."

Transport Layer Security (TLS) provides communications privacy over the Internet. The protocol allows client/server applications to communicate over a transport layer (e.g., TCP) in a way that is designed to prevent eavesdropping, tampering, or message forgery. For more information on TLS see IETF RFC-2246, incorporated herein by reference.

In one embodiment, the security functionality includes Cisco Compatible EXtensions (CCX). CCX includes security specifications for makers of 802.11xx wireless LAN chips for ensuring compliance with Cisco's proprietary wireless security LAN protocols. As is known in the art, Cisco Systems, Inc. of San Jose, Calif. is supplier of networking hardware and software, including router and security products.

However, the present invention is not limited to such security and encryption methods described herein and more, fewer and/or other types of security and encryption methods can be used to practice the invention. The security and encryption methods described herein can also be used in various combinations and/or in different layers of the protocol stack 38 with each other.

Cloud Computing Networks

Figure 4:
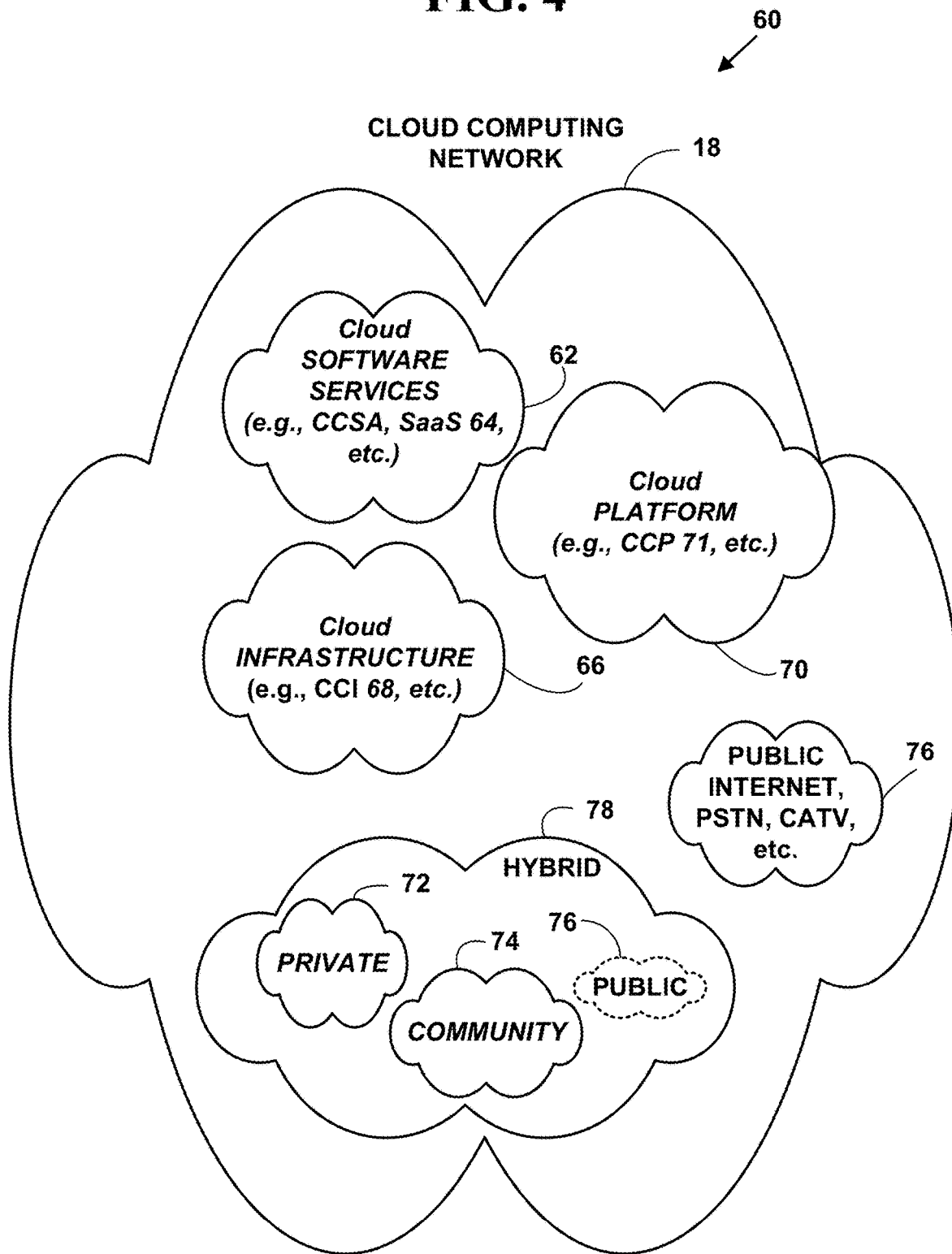
FIG. 4 is block diagram illustrating an exemplary cloud communications network.

FIG. 4 is a block diagram 60 illustrating an exemplary cloud computing network 18. The cloud computing network 18 is also referred to as a "cloud communications network" 18. However, the present invention is not limited to this cloud computing model and other cloud computing models can also be used to practice the invention. The exemplary cloud communications network includes both wired and/or wireless components of public and private networks.

In one embodiment, the cloud computing network 18 includes a cloud communications network 18 comprising plural different cloud component networks 72, 74, 76, 78. "Cloud computing" is a model for enabling, on-demand network access to a shared pool of configurable computing resources (e.g., public and private networks, servers, storage, applications, and services) that are shared, rapidly provisioned and released with minimal management effort or service provider interaction.

This exemplary cloud computing model for electronic information retrieval promotes availability for shared resources and comprises: (1) cloud computing essential characteristics; (2) cloud computing service models; and (3) cloud computing deployment models. However, the present invention is not limited to this cloud computing model and other cloud computing models can also be used to practice the invention.

Exemplary cloud computing essential characteristics appear in Table 1. However, the present invention is not limited to these essential characteristics and more, fewer or other characteristics can also be used to practice the invention.

TABLE 1

1. On-demand Energy Audit, Installation, Tracking, Inspection and Verification Services. Automatic Energy Audit, Installation, Tracking, Inspection and Verification Services can unilaterally provision computing capabilities, such as server time and network storage, as needed automatically without requiring human interaction with each network server on the cloud communications network 18. Such services include, but are not limited to, Javascript, JavaScript Object Notation (JSON), etc. services.
2. Broadband network access. Automatic Energy Audit, Installation, Tracking, Inspection and Verification Services capabilities are available over plural broadband communications networks and accessed through standard mechanisms that promote use by heterogeneous thin or thick client platforms (e.g., mobile phones, smart phones 14, tablet computers 12, laptops, PDAs, etc.). The broadband network access includes high speed network access such as 3 G, 4 G and 5 G wireless and/or wired and broadband and/or ultra-broad band (e.g., WiMAX, etc.) network access.
3. Resource pooling. Automatic Energy Audit, Installation, Tracking, Inspection and Verification Services resources are pooled to serve multiple requesters using a multi-tenant model, with different physical and virtual resources dynamically assigned and reassigned according to demand. There is location independence in that a requester of services has no control and/ or knowledge over the exact location of the provided by the Automatic Energy Audit, Installation, Tracking, Inspection and Verification Service resources but may be able to specify location at a higher level of abstraction (e.g., country, state, or data center). Examples of pooled resources include storage, processing, memory, network bandwidth, virtual server network device and virtual target network devices.
4. Rapid elasticity. Capabilities can be rapidly and elastically provisioned, in some cases automatically, to quickly scale out and rapidly released to quickly scale for Energy Audit, Installation, Tracking, Inspection and Verification Service collaboration. For automatic Automatic Energy Audit, Installation, Tracking, Inspection and Verification Services, multi-media collaboration converters, the automatic Energy Audit, Installation, Tracking, Inspection and Verification Services collaboration and analytic conversion capabilities available for provisioning appear to be unlimited and can be used in any quantity at any time.
5. Measured Services. Cloud computing systems automatically control and optimize resource use by leveraging a metering capability at some level of abstraction appropriate to the type of automatic Energy Audit, Installation, Tracking, Inspection and Verification Services (e.g., storage, processing, bandwidth, custom electronic content retrieval applications, etc.). Electronic Automatic Energy Audit, Installation, Tracking, Inspection and Verification Services interoperability services collaboration conversion usage is monitored, controlled, and reported providing transparency for both the automatic Energy Audit, Installation, Tracking, Inspection and Verification Services provider and the Automatic Energy Audit, Installation, Tracking, Inspection and Verification Service requester of the utilized electronic content storage retrieval service.

Exemplary cloud computing service models illustrated in FIG. 4 appear in Table 2. However, the present invention is not limited to these service models and more, fewer or other service models can also be used to practice the invention.

TABLE 2

1. Cloud Computing Software Applications 62 for Energy Audit, Installation, Tracking, Inspection and Verification Services (CCSA, SaaS 64, 64'). The capability to use the provider's applications 30, 30a, 30b, 30c, 30d running on a cloud infrastructure 66. The cloud computing applications 62, are accessible from the server network device 20 from various client devices 12, 14, 16 through a thin client interface such as a web browser, etc. The user TABLE 2-continued does not manage or control the underlying cloud infrastructure 66 including network, servers, operating systems, storage, or even individual application 30, 30a, 30b, 30c, 30d capabilities, with the possible exception of limited user-specific application configuration settings. The SaaS 64 includes a network device component for interacting with the SaaS 64' provided by a cloud server network device 20, 22, 24, 26.
2. Cloud Computing Infrastructure 66 for Energy Audit, Installation, Tracking, Inspection and Verification Services (CCI 68). The capability provided to the user is to provision processing, storage and retrieval, networks 18, 72, 74, 76, 78 and other fundamental computing resources where the consumer is able to deploy and run arbitrary software, which can include operating systems and applications 30, 30a, 30b, 30c, 30d. The user does not manage or control the underlying cloud infrastructure 66 but may and/or may not have control over operating systems, storage, deployed applications, and possibly limited control of select networking components (e.g., application layers, host firewalls, etc.).
3. Cloud Computing Platform 70 for Energy Audit, Installation, Tracking, Inspection and Verification Services (CCP 71). The capability provided to the user to deploy onto the cloud infrastructure 66 created or acquired applications created using programming languages and tools supported servers 20, 22, 24, 26, etc.. The user not manage or control the underlying cloud infrastructure 66 including network, servers, operating systems, or storage, but has control over the deployed applications 30a, 30b, 30c, 30d and possibly application hosting environment configurations.

Exemplary cloud computing deployment models appear in Table 3. However, the present invention is not limited to these deployment models and more, fewer or other deployment models can also be used to practice the invention.

TABLE 3

1. Private cloud network 72. The cloud network infrastructure is operated solely for Energy Audit, Installation, Tracking, Inspection and Verification. It may be managed by the electronic content retrieval or a third party and may exist on premise or off premise.
2. Community cloud network 74. The cloud network infrastructure is shared by several different organizations and supports a specific electronic content storage and retrieval community that has shared concerns (e.g., mission, security requirements, policy, compliance considerations, etc.). It may be managed by the different organizations or a third party and may exist on premise or off premise.
3. Public cloud network 76. The cloud network infrastructure such as the Internet, PSTN, SATV, CATV, Internet TV, etc. is made available to the general public or a large industry group and is owned by one or more organizations selling cloud services.
4. Hybrid cloud network 78. The cloud network infrastructure 66 is a composition of two and/or more cloud networks 18 (e.g., private 72, community 74, and/or public 76, etc.) and/or other types of public and/or private networks (e.g., intranets, etc.) that remain unique entities but are bound together by standardized or proprietary technology that enables data and application portability (e.g., cloud bursting for load-balancing between clouds, etc.)

Cloud software 64, 64' for electronic content retrieval takes full advantage of the cloud paradigm by being service oriented with a focus on statelessness, low coupling, modularity, and semantic interoperability for electronic content retrieval. However, cloud software services 64, 64' can include various states.

Cloud storage of desired electronic content on a cloud computing network includes agility, scalability, elasticity and multi-tenancy. Although a storage foundation may be comprised of block storage or file storage such as that exists on conventional networks, cloud storage is typically exposed to requesters of desired electronic content as cloud objects.

In one exemplary embodiment, the cloud application 30, 30a, 30b, 30c, 30d, 30', 30a', 30b', 30c', 30d' offers cloud services for Energy Audits, Installation, Tracking, Inspection and Verification. The application 30, 30a, 30b, 30c, 30d, 30', 30a', 30b', 30c', 30d' offers the cloud computing Infrastructure 66, 68 as a Service 62 (IaaS), including a cloud software infrastructure service 62, the cloud Platform 70, 71 as a Service 62 (PaaS) including a cloud software platform service 62 and/or offers Specific cloud software services as a Service 64 (SaaS) including a specific cloud software service 64, 64' for automatic Energy Audit, Installation, Tracking, Inspection and Verification services. The IaaS, PaaS and SaaS include one or more of cloud services 62 comprising networking, storage, server network device, virtualization, operating system, middleware, run-time, data and/or application services, or plural combinations thereof, on the cloud communications network 18.

Figure 5:
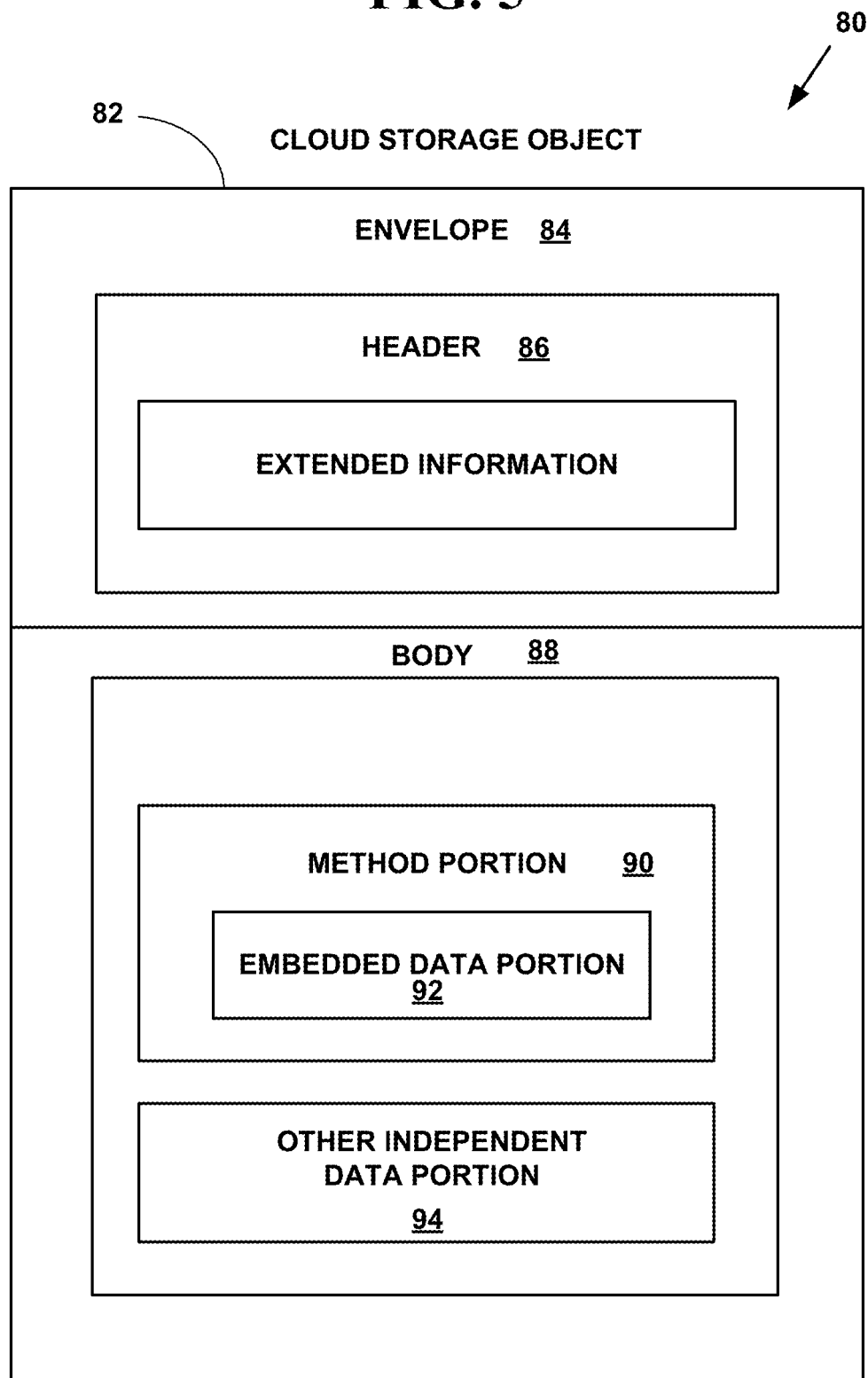
FIG. 5 is a block diagram illustrating an exemplary cloud storage object.

FIG. 5 is a block diagram 80 illustrating an exemplary cloud storage object 82. One or more server network devices (e.g., 20, 22, 24, 26, etc.) store portions 13', 15' of the electronic content 13, 15, 138, 146, 146' as cloud storage objects 82 (FIG. 5) 13'/82, 15'/82 as is described herein.

The cloud storage object 82 includes an envelope portion 84, with a header portion 86, and a body portion 88. However, the present invention is not limited to such a cloud storage object 82 and other cloud storage objects and other cloud storage objects with more, fewer or other portions can also be used to practice the invention.

The envelope portion 84 uses unique namespace Uniform Resource Identifiers (URIs) and/or Uniform Resource Names (URNs), and/or Uniform Resource Locators (URLs) unique across the cloud communications network 18 to uniquely specify, location and version information and encoding rules used by the cloud storage object 82 across the whole cloud communications network 18. For more information, see IETF RFC-3305, Uniform Resource Identifiers (URIs), URLs, and Uniform Resource Names (URNs), the contents of which are incorporated by reference.

The envelope portion 84 of the cloud storage object 82 is followed by a header portion 86. The header portion 86 includes extended information about the cloud storage objects such as authorization and/or transaction information, etc.

The body portion 88 includes methods 90 (i.e., a sequence of instructions, etc.) for using embedded application-specific data in data elements 92. The body portion 88 typically includes only one portion of plural portions of application-specific data 92 and independent data 94 so the cloud storage object 82 can provide distributed, redundant fault tolerant, security and privacy features described herein.

Cloud storage objects 82 have proven experimentally to be a highly scalable, available and reliable layer of abstraction that also minimizes the limitations of common file systems. Cloud storage objects 82 also provide low latency and low storage and transmission costs.

Cloud storage objects 82 are comprised of many distributed resources, but function as a single storage object, are highly fault tolerant through redundancy and provide distribution of desired electronic content across public communication networks 76, and one or more private networks 72, community networks 74 and hybrid networks 78 of the cloud communications network 18. Cloud storage objects 82 are also highly durable because of creation of copies of portions of desired electronic content across such networks 72, 74, 76, 78 of the cloud communications network 18. Cloud storage objects 82 includes one or more portions of desired electronic content and can be stored on any of the 72, 74, 76, 78 networks of the cloud communications network 18. Cloud storage objects 82 are transparent to a requester of desired electronic content and are managed by cloud applications 30, 30a, 30b, 30c, 30d.

In one embodiment, cloud storage objects 82 are configurable arbitrary objects with a size up to hundreds of terabytes, each accompanied by with a few kilobytes of metadata. Cloud objects are organized into and identified by a unique identifier unique across the whole cloud communications network 18. However, the present invention is not limited to the cloud storage objects described, and more fewer and other types of cloud storage objects can be used to practice the invention.

Cloud storage objects 82 present a single unified namespace or object-space and manages desired electronic content by user or administrator-defined policies storage and retrieval policies. Cloud storage objects includes Representational state transfer (REST), Simple Object Access Protocol (SOAP), Lightweight Directory Access Protocol (LDAP) and/or Application Programming Interface (API) objects and/or other types of cloud storage objects. However, the present invention is not limited to the cloud storage objects described, and more fewer and other types of cloud storage objects can be used to practice the invention.

REST is a protocol specification that characterizes and constrains macro-interactions storage objects of the four components of a cloud communications network 18, namely origin servers, gateways, proxies and clients, without imposing limitations on the individual participants.

SOAP is a protocol specification for exchanging structured information in the implementation of cloud services with storage objects. SOAP has at least three major characteristics: (1) Extensibility (including security/encryption, routing, etc.); (2) Neutrality (SOAP can be used over any transport protocol such as HTTP, SMTP or even TCP, etc.), and (3) Independence (SOAP allows for almost any programming model to be used, etc.)

LDAP is a software protocol for enabling storage and retrieval of electronic content and other resources such as files and devices on the cloud communications network 18. LDAP is a "lightweight" version of Directory Access Protocol (DAP), which is part of X.500, a standard for directory services in a network. LDAP may be used with X.509 security and other security methods for secure storage and retrieval. X.509 is public key digital certificate standard developed as part of the X.500 directory specification. X.509 is used for secure management and distribution of digitally signed certificates across networks.

An API is a particular set of rules and specifications that software programs can follow to communicate with each other. It serves as an interface between different software programs and facilitates their interaction and provides access to automatic Energy Audit, Installation, Tracking, Inspection and Verification Services in a cloud or non-cloud environment. In one embodiment, the API for Energy Audit services is available to network devices 12, 14, 16, 20, 22, 24, 26, 27, 29, 27, 29, 31, 33, 35, 37, 98-104 and networks 18, 18'. However, the present invention is not limited to such an embodiment and other embodiments can be used to practice the invention.

Wearable Devices

Wearable technology" and/or "wearable devices" are clothing and accessories incorporating computer and advanced electronic technologies. Wearable network devices provide several advantages including, but not limited to: (1) Quicker access to notifications. Important and/or summary notifications are sent to alert a user to view the whole message. (2) Heads-up information. Digital eye wear allows users to display relevant information like directions without having to constantly glance down; (3) Always-on Searches. Wearable devices provide always-on, hands-free searches; and (4) Recorded data and feedback. Wearable devices take telemetric data recordings and providing useful feedback for users for exercise, health, fitness, etc. activities.

Figure 6:
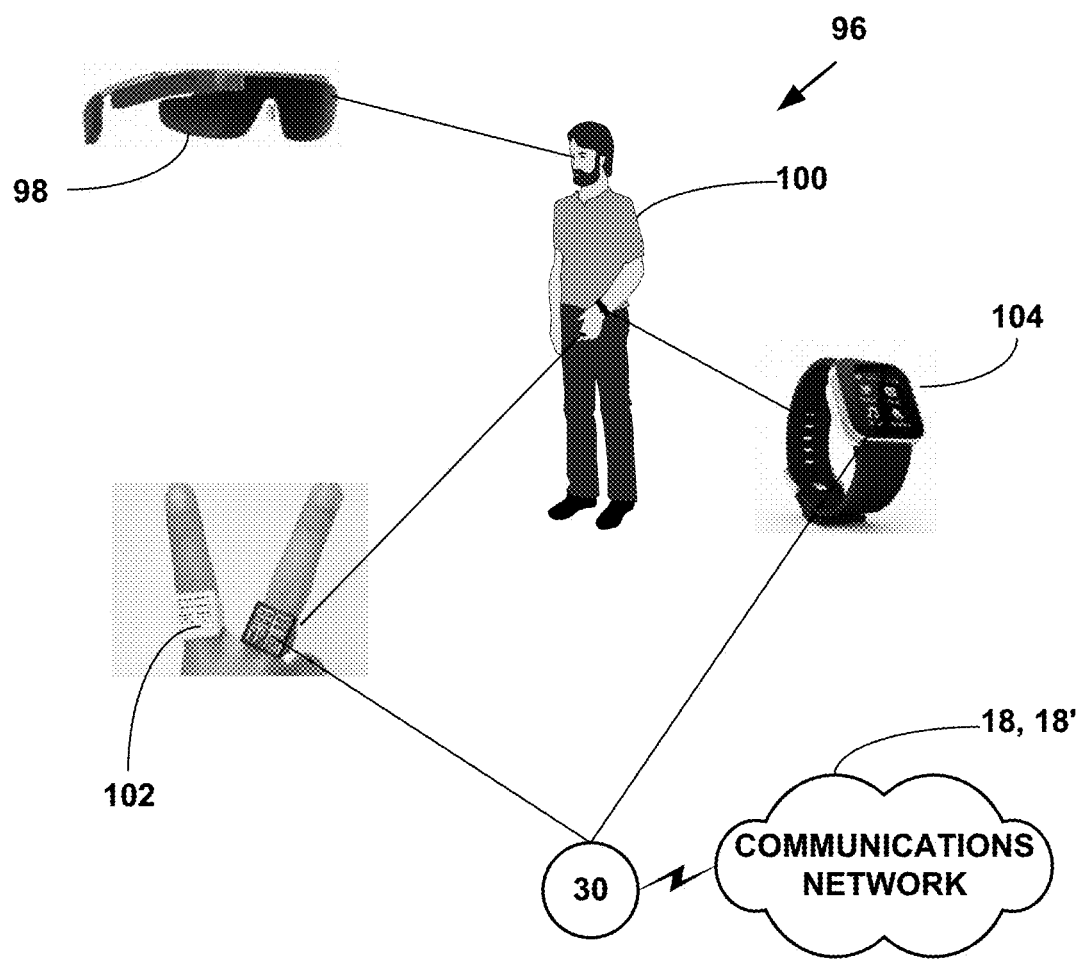
FIG. 6 is a block diagram illustrating wearable network devices.

FIG. 6 is a block diagram with 96 illustrating wearable devices. The wearable devices include one or more processors and include, but are not limited to, wearable digital glasses 98, clothing 100, jewelry 102 (e.g., smart rings, smart earrings, etc.) and/or watches 104. However, the present invention is not limited to such embodiments and more, fewer and other types of wearable devices can also be used to practice the invention.

In one specific embodiment, the application 30, 30a, 30b, 30c, 30d interacts with wearable devices 98-104 automatic Energy Audit, Installation, Tracking, Inspection and Verification Services the methods described herein However, the present invention is not limited this embodiment and other embodiments can also be used to practice the invention.

Artificial Intelligence (AI) and Big Data

"Artificial intelligence" (AI), also known as machine intelligence (MI), is intelligence demonstrated by machines, in contrast to the natural intelligence (NI) displayed by humans and other animals. AI research is defined as the study of "intelligent agents." Intelligent agents are any software application or hardware device that perceives its environment and takes actions that maximize its chance of successfully achieving its goals. Colloquially, the term "artificial intelligence" is applied when a machine mimics "cognitive" functions that humans associate with human brains, such as learning, problem solving and comparing large number of data points.

In one embodiment, the present invention uses one or more AI methods including, but are not limited to, AI knowledge-based methods 30c for Energy Audit, Installation, Tracking, Inspection and Verification Services. However, the present invention is not limited to such an embodiment and more, fewer and/or other AI methods can be used to practice the invention.

In one embodiment, SaaS 64, 64' includes and AI application 30c with the AI methods described herein. In another embodiment, the AI application 30c is a standalone application. However, the present invention is not limited to such an embodiment, and the AI application 30c can be provided in other than the SaaS 64, 64'.

"Big Data" refers to the use of predictive analytic methods that extract value from data, and to a particular size of data set. The quantities of data used are very large, at least 100,000 data points and more typically 500,000 to 1 Million+data points. Analysis of Big Data sets are used to find new correlations and to spot trends. In one embodiment, SaaS 64, 64' includes and Big Data application 30d with the Big Data described herein.

In one embodiment, the AI methods described herein collect data information to create and store (e.g., in cloud storage object 82, etc.) a Big Data that is used to analyze trends find new correlations and to spot trends. However, the present invention is not limited to such an embodiment and the AI methods described herein can be used without Big Data sets.

In one embodiment, the AI methods include predictive analysis methods. "Predictive analysis" is an AI method that uses data mining, statistics, and modelling to make predictions. This AI method mines and analyses historical data patterns to predict future outcomes by extracting information from data sets including Big Data sets to determine patterns and trends. For example, energy consuming component-X manufactured by company-Y consumes 10% more energy than energy consuming component-A manufactured by company-B, energy consuming component-C burns out 15% faster than energy consuming component-D, etc. However, the present invention is not limited to such embodiments and other AI methods can be used to practice the invention.

In another embodiment, the AI methods include anomaly detection. "Anomaly detection" AI methods analyzes data, including Big Data and pinpoints anything out of usual operations or usual expectations. For example, energy consuming component-E manufactured by company-F in batch-XYZ, fails 60% of the time within one month after installation, etc. However, the present invention is not limited to such embodiments and other AI methods can be used to practice the invention.

In another embodiment, the AI methods include clustering analysis. "Clustering analysis" AI methods include dividing a population or data points or Big Data points into a number of groups such that data points in the same groups are more similar to other data points in the same group and dissimilar to the data points in other groups. It includes a collection of objects on a basis of similarity and dissimilarity between them. For example, energy consuming component-LED-1 manufactured by companies G, H and I, consume 5% less energy than energy consuming component LED-2 manufactures by companies J, K and L, etc. However, the present invention is not limited to such embodiments and other AI methods can be used to practice the invention.

In another embodiment, the AI methods include predictive analysis, anomaly detection and/or clustering analysis and/or a combination thereof. However, the present invention is not limited to such embodiments and other AI methods can be used to practice the invention.

Short Message Service (SMS) Messaging

Short Message Service (SMS) is an electronic text messaging service component of phone, Web, or mobile communication systems. It uses standardized communications protocols to allow fixed line or mobile phone devices to exchange short text messages.

SMS messages were defined in 1985 as part of the Global System for Mobile Communications (GSM) series of standards as a means of sending messages of up to 160 characters to and from GSM mobile handsets. Though most SMS messages are mobile-to-mobile text messages, support for the service has expanded to include other mobile technologies as well as satellite and landline networks.

The SMS Internet Engineering Task Force (IETF) Request for Comments (RFC) 5724, ISSN: 2070-1721, 2010, is incorporated herein by reference.

Rich Communication Suite (RCS)

Rich Communications Suite/Rich Communications System (RCS) is a communication protocol between mobile telephone carriers, between phones and carriers, and between individual devices aiming at replacing SMS messages with a message system that is richer, provides phonebook polling (e.g., for service discovery, etc.), and can transmit in-call multimedia. It is also marketed under the names of Advanced Messaging, Advanced Communications, Chat, joyn, Message+ and SMS+. RCS is also a communication protocol available for device-to-device (D2D) exchanges without using a telecommunications carrier for devices that are in close physical proximity (e.g., between two IoT devices, smart phones, smart phone and electronic tablet, etc.)

One advantage RCS Messaging has over SMS is that RCS enables users to send rich, verified messages including photos, videos and audio messages, group messages, read receipts, indicators to show other users are typing a message, carousel messages, suggested chips, chat bots, barcodes, location integration, calendar integration, dialer integration, and other RCS messaging features. RCS messaging includes person-to-person (P2P), application-to-person (A2P), application-to-application (A2A), application-to-device (A2D) and/or device-to-device (D2D) messaging.

The RCS Interworking Guidelines Version 14.0, 13 Oct. 2017, GSM Association, Rich Communication Suite RCS API Detailed Requirements, version 3.0, Oct. 19, 2017, Rich Communication Suite 8.0 Advanced Communications Services and Client Specification Version 9.0, 16 May 2018, RCS Universal Profile Service Definition Document Version 2.2, 16 May 2018, and Rich Communication Suite Endorsement of OMA CPM 2.2 Conversation Functions Version 9.0, 16 Oct. 2019, are all incorporated herein by reference.

The Rich Communication Suite-Enhanced (RCS-e) includes methods of providing first stage interoperability among Mobile Network Operators (MNOs). RCS-e is a later version of RCS which enables mobile phone end users to use instant messaging (IM), live video sharing and file transfer across any device on any MNO.

The RCS functionality of the present invention includes, but is not limited to, one and two way, rich, verified, multimedia messages including photos, videos and audio messages, group messages, read receipts, indicators to show other users are typing a message, predefined quick-reply suggestions, rich cards, carousels, action buttons, maps, click-to-call, calendar integration, geo-location, etc. The RCS functionality also includes RCS emulators and/or thin RCS applications that provide full and/or selected features of available RCS functionality.

Energy Audit, Installation, Tracking, Inspection and Verification Services

FIGS. 7A, 7B and 7C are a flow diagram illustrating a Method 106 for energy audit installation, tracking, inspection and verification services. In FIG. 7A at Step 108, an electronic floorplan of a building for conducting an energy audit of energy consuming components is provided on an energy audit application on network device with one or more processors, a non-transitory computer readable medium and a communications interface for connecting the network device to a communications network. At Step 110, a configurable electronic template is provided on energy audit application on the network device for conducting the energy audit of the energy consuming components, the configurable electronic template dynamically configurable during the energy audit. At Step 112, the network device is moved physically into the building to plural different physical locations within the building, the network device is not connected to the communication network within the building and a selected physical location of the network device in the building corresponds to a selected virtual location on the electronic floorplan for the building. At Step 114, a creation selection input is received on on the energy audit application on the network device to create a graphical marker for a selected energy consuming component at a specific location on the electronic floorplan of the building. At Step 116, a graphical marker is displayed in a first color on the energy audit application on the network component at the specific location on the electronic floorplan of the building for the selected energy consuming component. In FIG. 7B at Step 118, plural collection selection inputs are received on the energy audit application on network device including: (a) audio information from an audio component on the network device (b) visual information from a camera component on the network device, and (c) electronic information from an electronic keyboard component on the network device, the audio, visual and electronic information including information collected for the selected energy consuming component at the specific location on the electronic floorplan of the building. At Step 120, the received audio, visual and electronic information is stored in the configurable electronic template on the energy audit application on network device. At Step 122, steps 114 through 120 are repeated for plural of other selected energy consuming components at plural other specific locations on the electronic floorplan of the building. At Step 124, an energy audit summary report is created on the energy audit application on the network device with the stored audio, visual and electronic information. The energy audit summary report is dynamically updated on the energy audit application on the network device as energy consuming components are identified in the building. In FIG. 7C at Step 126, the network device is moved to a new physical location inside or outside of the building that allows the network device to connect to the communications network via the communications interface on the network device. At Step 128, the energy audit application on the network device connects via the communications interface on the network device to a server energy audit application on a server network device with one or more processor via the communications network. At Step 130, the data stored on the energy audit application on network device is automatically synchronized with the server energy audit application on the server network device, thereby allowing energy audit information for the electronic floorplan of the building to be identical on the network device and the server network device.

Figure 8:
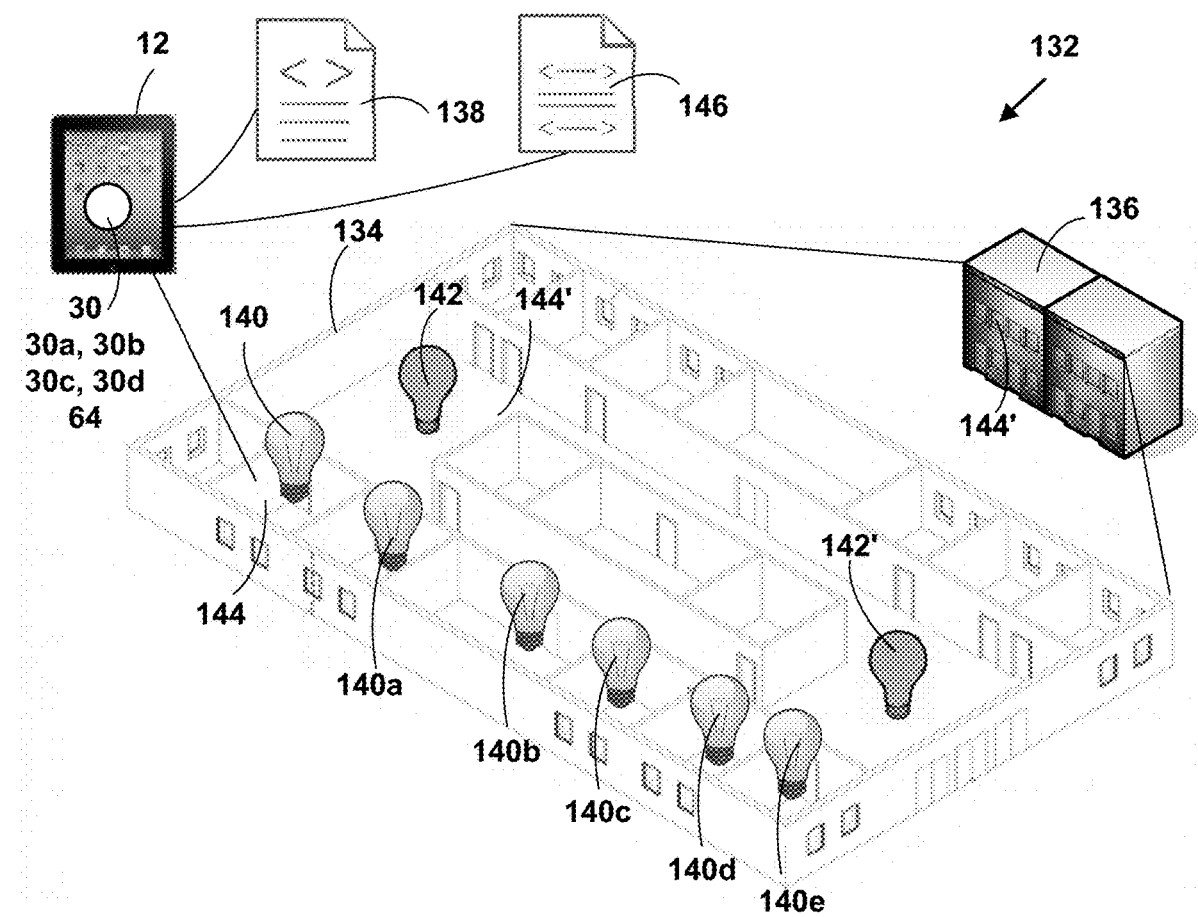
FIG. 8 is a block diagram illustrating components of energy audits.

FIG. 8 is a block diagram 132 illustrating components of energy audits. The energy audit components include an electronic floor plan 134 for a building 136, a configurable electronic template 138, energy consuming components 140, 142, location 144, In FIG. 7, Method 106 is illustrated with an illustrative embodiment. However the present invention is not limited to this illustrative embodiment and other embodiments can be used to practice the invention.

In such an illustrative embodiment in FIG. 7A at Step 108, an electronic floorplan 13, 134 of a building for conducting an energy audit of energy consuming components is provided on an energy audit application 30, 30a, 30b, 30c, 30d, 64 (SaaS 64 when online) on network device 12, 14, 16, 27, 29, 27, 29, 31, 33, 35, 37, 98-104 with one or more processors, a non-transitory computer readable medium and a communications interface for connecting the network device to a communications network 18, 18'.

In one embodiment, the electronic floorplan of the building is created with a Computer Aided Design (CAD), Building Information Modeling (BIM) program, 3D modeling program and/or other design program. However, the present invention is not limited to such embodiments and other program can be used to create electronic floor plans 134 of a building 136.

For example, the BIM and/or 3D modeling programs, include, but are not limited to, AUTODESK REVIT, AUTODESK INVENTOR, AUTOCAD, SKETCHUP, VECTORWORKS, MICROSTATION, ARCHICAD, SOLIDWORKS, PROE, AGI32, etc. However, the present invention is not limited to such embodiments and other embodiment can be used to practice the invention.

In one embodiment, the energy consuming components include, but are not limited to, lighting, heating, ventilation, air conditioning, motors, variable frequency drives, transformers, generators and/or combinations thereof. However, the present invention is not limited so such embodiments and any other energy consuming components can be used to practice the invention.

At Step 110, a configurable electronic template 138 is provided on energy audit application 30, 30a, 30b, 30c, 30d, 64 the network device 12, 14, 16, 27, 29, 27, 29, 31, 33, 35, 37, 98-104 for conducting the energy audit of the energy consuming components 140, 142, the configurable electronic template 138 dynamically configurable during the energy audit.

In one embodiment, the energy audit application 30, 30a, 30b, 30c, 30d, 64 the network device 12, 14, 16, 27, 29, 27, 29, 31, 33, 35, 37, 98-104 includes a template wizard to assist in creating plural data fields in configurable electronic template 138. In such an embodiment, the template wizard provides assistance by presenting questions (e.g., "what type of lighting are you auditing? (1) incandescent, (2) florescent, (3) LED?", etc.) and then automatically creating appropriate data fields in the configurable electronic template 138. However, the present invention is not limited to such an embodiment and the invention can be practiced with and/out a template wizard.

For example, the configurable electronic template 138 may be configured to collect information on florescent lights with data fields including light bulb length, brand, ballast, starter, diffusers, cover types, etc. as a building 136 may include a majority of florescent lights. During the energy audit, it is decided to collect lumen values for all the florescent lights, so a lumen data field is dynamically added to the configurable electronic template 138. Then during an energy audit several store rooms with incandescent lights are encountered. The configurable electronic template 138 is dynamically configurable to add additional fields for the incandescent lights. However, the present invention is not limited to such an embodiment and other embodiment can be used to practice the invention.

At Step 112, the network device 12, 14, 16, 27, 29, 27, 29, 31, 33, 35, 37, 98-104 is moved physically into the building 136 to plural different physical locations within the building, the network device 12, 14, 16, 27, 29, 27, 29, 31, 33, 35, 37, 98-104 is not connected to the communication network 18, 18' within the building 136 (i.e., is offline, etc.) and a selected physical location 144 of the network device 12 in the building 136 corresponds to a selected virtual location 144' on the electronic floorplan 13, 134 for the building 136.

In one embodiment, the network device 12, 14, 16, 27, 29, 27, 29, 31, 33, 35, 37, 98-104 must work offline because the building 136 includes a large amount of concrete, steel or other building materials that interfere or prevent the network device 12, 14, 16, 27, 29, 27, 29, 31, 33, 35, 37, 98-104 device from ever successfully connecting to a communications network 18, 18'. In addition, the network device 12, 14, 16, 27, 29, 27, 29, 31, 33, 35, 37, 98-104 may be physically located in a service closet, an attic, interior spaces of building, etc. that prevent successful connections to the communications network 18, 18'. The network device 12, 14, 16, 27, 29, 27, 29, 31, 33, 35, 37, 98-104 is able to work offline and complete all its desired tasks and automatically synchronize all energy audit data it has collected at a later time. Working offline also provides an additional advantage of not running down a battery on the network device 12, 14, 16, 27, 29, 27, 29, 31, 33, 35, 37, 98-104 that may be constantly trying to connect with the communications network 18, 18' without ever being successful because of its physical location inside the building 136.

At Step 114, a creation selection input is received on the energy audit application 30, 30a, 30b, 30c, 30d, 64 on the network device 12, 14, 16, 27, 29, 27, 29, 31, 33, 35, 37, 98-104 to create a graphical marker 140 for a selected energy consuming component at a specific location 144 on the electronic floorplan 134 of the building 136.

In one embodiment, the graphical marker includes a specific graphical marker representing and graphically illustrating a specific type of energy consuming component and/or specific type of energy producing component. However, the present invention is not limited to such embodiments and other embodiments can be used to practice the invention.

In one embodiment, energy audit application 30, 30a, 30b, 30c, 30d, 64 on the network device 12, 14, 16, 27, 29, 27, 29, 31, 33, 35, 37, 98-104 includes a graphical component fixture wizard with plural selectable graphical objects that visually identify a plural different energy consuming components and energy producing components to ensure each energy consuming component and energy producing component is fully defined and consistently identified on the electronic floorplan 134 of the building 136. However, the present invention is not limited to such embodiments and other embodiments can be used to practice the invention.

FIG. 8 illustrates the graphical marker 140 as a graphical light bulb for a incandescent lighting component for the selected energy consuming component. However, the present invention is not limited to this embodiment and other graphical markers can be used for lighting and for the selected energy consuming component.

Returning to FIG. 7A at Step 116, the graphical marker 140 is displayed in a first color (e.g., yellow, etc.) on the energy audit application 30, 30a, 30b, 30c, 30d, 64 on the network component 12 at the specific location 144 on the electronic floorplan 134 of the building 136 for the selected energy consuming component 140.

In FIG. 7B at Step 118, plural collection selection inputs are received on the energy audit application 30, 30a, 30b, 30c, 30d, 64 on network device 12, 14, 16, 27, 29, 27, 29, 31, 33, 35, 37, 98-104 including: (a) audio information from an audio component on the network device 12, 14, 16, 27, 29, 27, 29, 31, 33, 35, 37, 98-104, (b) visual information from a camera component 29, including but not limited to a 360-degree camera component 29' on the network device 12, 14, 16, 27, 29, 27, 29, 31, 33, 35, 37, 98-104, and (c) electronic information from an electronic keyboard component on the network device 12, 14, 16, 27, 29, 27, 29, 31, 33, 35, 37, 98-104, the audio, visual and electronic information including information collected for the selected energy consuming component 140 at the specific location 144 on the electronic floorplan 134 of the building 136.

In one embodiment, the audio information captured on the camera component on the network device includes, but is not limited to, voice recordings. However, the present invention is not limited to such an embodiment and other embodiments can be used to practice the invention.

In one embodiment, the visual information captured on the camera component on the network device includes, but is not limited to, still pictures, video and 360-degree view visual information. However, the present invention is not limited to such an embodiment and other embodiments can be used to practice the invention.

In one embodiment, the visual information includes still pictures and/or videos that include additional annotated and/or markup information for individual energy consuming components. For example, "this florescent light has the oldest starter in the building and needs to be replaced first," etc. However, the present invention is not limited to this embodiment and other embodiments can be used to practice the invention.

In another embodiment Step 118 further includes collecting audio, visual and electronic information from energy producing components on an energy audit application 30, 30a, 30b, 30c, 30d, 64 on network device 12, 14, 16, 27, 29, 27, 29, 31, 33, 35, 37, 98-104. However, the present invention is not limited to this embodiment and other embodiments can be used to practice the invention.

In one embodiment, the energy producing components include, but are not limited to, solar (e.g., solar panels, photovoltaic systems, etc.), wind (e.g., turbines, etc.), water (e.g., hydroelectric, etc.), biomass (e.g., algae, garbage, etc.) energy producing components and combinations thereof. However, the present invention is not limited so such embodiments and any other energy producing components can be used to practice the invention.

In one embodiment, Step 118 further includes applying automatically one or more Artificial Intelligence (AI) methods to the audio, visual and electronic information collected for the selected energy consuming component 140 to provide additional information about the selected energy consuming component 140. In one embodiment, the AI methods include predictive analysis, anomaly detection and/or clustering analysis and/or a combination thereof. The AI methods are used with and/or without Big Data. However, the present invention is not limited to such embodiments and more, fewer and other AI methods can be used to practice the invention. In addition, the invention can be practice without using AI methods.

In one embodiment, the network device 12, 14, 16, 27, 29, 27, 29, 31, 33, 35, 37, 98-104 further includes one or more additional sensing components to measure: distance, location, energy output, light output, airflow, electrical input and output, water flow, pressure or temperature of the energy consuming components.

For example, a laser meter is used to measure distance, a Global Positioning System (GPS) component is used to measure location, electric meters to measure energy output and electrical input and output, a lumen meter to measure light output, an airflow meter to measure airflow, a water flow meter to measure water flow, a pressure meter to measure pressure, and/or a thermometer to measure temperature, etc. However, the present invention is not limited to such embodiments and other embodiment can be used to practice the invention.

The sensing components, include but are not limited to, additional components that are added to the network device and/or applications that using existing hardware on the network device 12, 14, 16, 27, 29, 27, 29, 31, 33, 35, 37, 98-104. However, the present invention is not limited to such embodiments and other embodiment can be used to practice the invention.

The additional sensing components are used to collect additional information about the energy consuming components for the energy audits. If an energy audit is being conducting on lighting components, a lumen meter is used to collect data from existing lighting components. A "lumen" is a unit of measurement for the brightness of light. A lumen is defined as "a unit of luminous flux equal to the amount of light given out through a solid angle of one steradian by a point source of one candela intensity radiating uniformly in all directions." Different types of lighting components provide light with different amounts of lumens while consuming different amounts of energy.

For example, a 10 watt Light Emitting Diode (LED) bulb emits about 800 lumens, cost about $1.34 per year to operate and has an average life span of about 25,000 hours. In stark contrast, a 10 watt florescent light bulb emits about 450 lumens, cost about $1.73 per year to operate and has an average life span of about 8000 hours. If a room has two florescent bulbs, they would provide about 900 lumens and cost about $3.46 per year to operate. Thus, the two florescent bulbs could be replaced with one LED bulb that generates a similar amount of lumens (800 vs. 900) and at a yearly cost savings of about $2.12 ($3.46-$1.34), etc. Collecting such additional information is very important if the energy audit is being using to replace and/or retrofit existing energy consuming components in a commercial or industrial building with a large amount of energy consuming components.

At Step 120, the received audio, visual and electronic information is stored in the configurable electronic template 138 on the energy audit application 30, 30a, 30b, 30c, 30d, 64 on network device 12, 14, 16, 27, 29, 27, 29, 31, 33, 35, 37, 98-104.

In one embodiment, the network device 12, 14, 16, 27, 29, 27, 29, 31, 33, 35, 37, 98-104 stores the received audio, visual and electronic information in one or more cloud storage objects 82 on a cloud communications network 18 when the network device 12, 14, 16, 27, 29, 27, 29, 31, 33, 35, 37, 98-104 later connects to the communications network 18' including a cloud communications network 18.

At Step 122, steps 114 through 120 are repeated for plural of other selected energy consuming components 140a-140e at plural other specific locations on the electronic floorplan 134 of the building 138.

One or more graphical markers are changed from the first color 140 (e.g., yellow, etc.) to a second color 142, 142' (e.g., green, etc.) on the energy audit application 30, 30a, 30b, 30c, 30d, 64 on the network device 12, 14, 16, 27, 29, 27, 29, 31, 33, 35, 37, 98-104 at selected specific locations 144' on the electronic floorplan 134 of the building 136 to visually indicate where information collection for selected energy consuming components has been completed.

A third color (e.g., red, etc.) is used on the on the energy audit application 30, 30a, 30b, 30c, 30d, 64 on the network device 12, 14, 16, 27, 29, 27, 29, 31, 33, 35, 37, 98-104 at selected specific locations 144' on the electronic floorplan 134 of the building 136 to visually indicate where no information collection for selected energy consuming components has been completed and/or there is some other type of issue or problem that has occurred and needs to be addressed.

At Step 124, an energy audit summary report 146 is created on the energy audit application 30, 30a, 30b, 30c, 30d, 64 on the network device 12, 14, 16, 27, 29, 27, 29, 31, 33, 35, 37, 98-104 with the stored audio, visual and electronic information. The energy audit summary report 146 is dynamically updated on the energy audit application 30, 30a, 30b, 30c, 30d on the network device 12, 14, 16, 27, 29, 27, 29, 31, 33, 35, 37, 98-104 as energy consuming components 140a-140e are identified in the building 136.

In FIG. 7C at Step 126, the network device 12, 14, 16, 27, 29, 27, 29, 31, 33, 35, 37, 98-104 is moved to a new physical location inside or outside of the building that allows the network device to connect to the communications network 18, 18' via the communications interface on the network device 12, 14, 16, 27, 29, 27, 29, 31, 33, 35, 37, 98-104 either with a wireless or wired connection.

At Step 128, the energy audit application 30, 30a, 30b, 30c, 30d, 64 on the network device 12, 14, 16, 27, 29, 27, 29, 31, 33, 35, 37, 98-104 connects via the communications interface on the network device 12, 14, 16, 27, 29, 27, 29, 31, 33, 35, 37, 98-104 to a server energy audit application 30', 30a', 30b', 30c', 30d', 64' on a server network device 20, 22, 24, 26 with one or more processor via the communications network 18, 18'.

At Step 130, the data stored 13, 15, 13'/82, 15'/82, 138, 146 on the energy audit application 30, 30a, 30b, 30c, 30d, 64 on the network device 12, 14, 16, 27, 29, 27, 29, 31, 33, 35, 37, 98-104 is automatically synchronized with the server energy audit application 30', 30a', 30b', 30c', 30d', 64' on the server network device 12, 14, 16, 27, 29, 27, 29, 31, 33, 35, 37, 98-104, thereby allowing energy audit information for the electronic floorplan 134 of the building 136 to be identical on the network device 12, 14, 16, 27, 29, 27, 29, 31, 33, 35, 37, 98-104 and the server network device 20, 22, 24, 26.

In one embodiment, energy audit information is collected on multiple network devices 12, 14, 16, 27, 29, 27, 29, 31, 33, 35, 37, 98-104 and at Step 130 the energy audit information from all the multiple network devices 12, 14, 16, 27, 29, 27, 29, 31, 33, 35, 37, 98-104 is automatically synchronized whenever the multiple network devices 12, 14, 16, 27, 29, 27, 29, 31, 33, 35, 37, 98-104 connect to the communications network 18, 18' and are in a connect (i.e., on-line) state.

In one embodiment, the server energy audit application 30', 30a', 30b', 30c', 30d', 64' on the server network device 20, 22, 24, 26 automatically applies one or more Artificial Intelligence (AI) methods to the audio, visual and electronic information collected for the selected energy consuming component 140 and the selected other plural energy consuming components 140a-140e, 142 to provide additional information the about plural selected energy consuming components 140, 140a-140e, 142. The AI methods are used with and/or without Big Data. However, the present invention is not limited to such embodiments and more, fewer and other AI methods can be used to practice the invention. In addition, the invention can be practice without using AI methods.

In one embodiment, the additional information about the plural selected energy consuming components 140a-140e, 142 includes one or more electronic links to one or more information sources including existing electronic product and price information about the existing plural selected energy consuming components 140a-140e, 142 and new electronic information and new price information for new energy consuming components that can replace the existing plural selected energy consuming components 140a-140e, 142 in the building 136.

For example Table 4 illustrates exemplary additional information that is available via the one or more electronic links (e.g., underlined in Table 4, etc.) for lighting components. Table 4 is exemplary only. The present invention is not limited to such embodiments and other embodiments can be used to practice the invention.

TABLE 4

| LED Bulbs | Compact Florescent Lamp (CFL) Bulbs | Incandescent Bulbs |
| --- | --- | --- |
| Brightness: 10 W/800 Lumens | Brightness: 10 W/450 Lumens | Brightness: 10 W/80 Lumens |
| Operating Cost: $1.34 per year | Operating Cost: $1.73 per year | Operating Cost: $3.05 per year |
| Product Data Sheets | Product Data Sheets | Product Data Sheets |
| Energy Efficiency Data | Energy Efficiency Data | Energy Efficiency Data |

TABLE 4-continued

| LED Bulbs | Compact Florescent Lamp (CFL) Bulbs | Incandescent Bulbs |
| --- | --- | --- |
| Manufacturer: | Manufacturer: | Manufacturer: |
| PHILLIPS | PHILLIPS | PHILLIPS |
| CREE | CREE | CREE |
| GENERAL | GENERAL | GENERAL |
| ELECTRIC | ELECTRIC | ELECTRIC |
| Purchase: | Purchase: | Purchase: |
| AMAZON.com | AMAZON.com | AMAZON.com |
| LOWES.com | LOWES.com | LOWES.com |
| HOME DEPOT.com | HOME DEPOT.com | HOME DEPOT.com |

Figure 9:
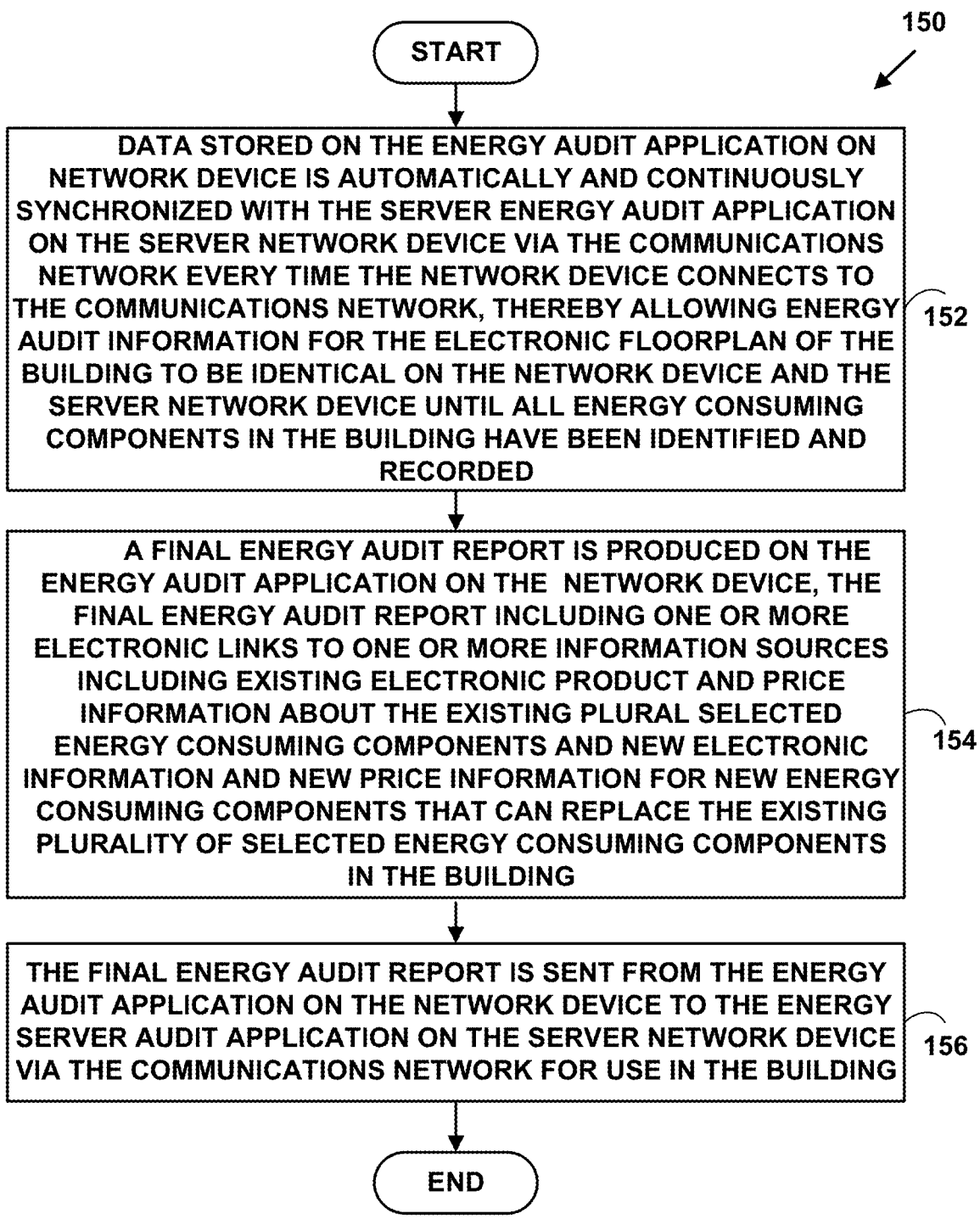
FIG. 9 is flow diagram illustrating a method for providing energy audits.

FIG. 9 is flow diagram illustrating a Method 150 for providing energy audits. At Step 152, data stored on an energy audit application on a network device is automatically and continuously synchronized with a server energy audit application on a server network device via a communications network every time the network device connects to the communications network, thereby allowing energy audit information, progress, verification, inspection for an electronic floorplan of a building to be identical on the network device and the server network device until all energy consuming components in the building have been identified and recorded. At Step 154, a final energy audit report is produced on the energy audit application on the network device, the final energy audit report including one or more electronic links to one or more information sources including existing electronic product and price information about the existing plurality of selected energy consuming components and new electronic information and new price information for new energy consuming components that can replace the existing plurality of selected energy consuming components in the building. At Step 156, the final energy audit report is sent from the energy audit application on the network device to the energy server audit application on the server network device via the communications network for use in the building.

Method 150 is illustrated with an illustrative embodiment. However the present invention is not limited to this illustrative embodiment and other embodiments can be used to practice the invention.

In such an illustrative embodiment in FIG. 9 at Step 152, data stored on an energy audit application 30, 30a, 30b, 30c, 30d, 64 on a network device 12, 14, 16, 27, 29, 27, 29, 31, 33, 35, 37, 98-104 is automatically and continuously synchronized with a server energy audit application 30', 30a', 30b', 30c', 30d', 64' on a server network device 20, 22, 24, 26 via a communications network 18, 18' every time the network device 12, 14, 16, 27, 29, 27, 29, 31, 33, 35, 37, 98-104 connects to the communications network 18, 18', thereby allowing energy audit information, progress, verification, inspection for the electronic floorplan 134 of the building 136 to be identical on the network device 12, 14, 16, 27, 29, 27, 29, 31, 33, 35, 37, 98-104 and the server network device 20, 22, 24, 26 until all energy consuming components in the building 136 have been identified and recorded.

At Step 154, a final energy audit report 146' is produced on the energy audit application 30, 30a, 30b, 30c, 30d, 64 on the network device 12, 14, 16, 27, 29, 27, 29, 31, 33, 35, 37, 98-104 the final energy audit report including one or more electronic links (e.g., Table 4, etc.) to one or more information sources including existing electronic product and price information about the existing plurality of selected energy consuming components and new electronic information and new price information for new energy consuming components that can replace the existing plural selected energy consuming components in the building 136.

At Step 156, the final energy audit report 146' is sent from the energy audit application 30, 30a, 30b, 30c, 30d, 64 on the network device 12, 14, 16, 27, 29, 27, 29, 31, 33, 35, 37, 98-104, to the server energy audit application 30', 30a', 30b', 30c', 30d', 64' on the server network device 20, 22, 24, 26 via the communications network 18, 18' for use on the network device 20, 22, 24, 26 in the building 136.

A method and system for providing energy audits is presented herein. The method and system allow an energy audit to be conducted offline on an energy audit application on network device for energy consuming components (e.g., lighting, heating, ventilation, air condition, etc.) and energy producing components (e.g., solar, wind, water, etc.) and automatically synchronized to a server network device when the network device is able to connect to a communications network. Energy audit templates are provided to ensure all energy consuming components and energy producing components are fully defined and consistently identified on an electronic floorplan for a commercial or industrial building.

It should be understood that the architecture, programs, processes, methods and systems described herein are not related or limited to any particular type of computer or network system (hardware or software), unless indicated otherwise. Various types of specialized computer systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

While various elements of the preferred embodiments have been described as being implemented in software, in other embodiments hardware or firmware implementations may alternatively be used, and vice-versa.

Therefore, all embodiments that come within the scope and spirit of the proceeding described and equivalents thereto are identified and claimed as the invention.

We claim:

1. A method for providing energy audits, comprising:
providing an electronic floorplan of a building for conducting an energy audit of energy consuming components on an energy audit application on a network device with one or more processors, a non-transitory computer readable medium and a communications interface for connecting the network device to a communications network;
providing via the energy audit application a creation component to create and change colors for plurality of graphical markers for energy consuming components at specific locations on the electronic floorplan of the building, the plurality of graphical markers including progress indicators comprising a first color for a selected energy consuming component indicating energy audit information has not been collected for the selected energy consuming component, a second color indicating the energy audit information has been collected for the selected energy consuming component and a third color indicating a problem exists with the selected energy consuming component that requires additional action;

providing via the energy audit application a template wizard presenting questions to be answered to assist in creating a plurality of new data fields in a configurable electronic template with a plurality of information fields;

providing the configurable electronic template on energy audit application the network device for conducting the energy audit of the energy consuming components, the configurable electronic template dynamically configurable during the energy audit;

(1) moving the network device physically into the building to a plurality of first different physical locations within the building, wherein the network device is connected to the communications network;

(2) moving the network device to one or more selected second physical locations wherein the building materials of the building prevent a successful connection to the communications network and the network device is designated as offline and not connected to the communication network within the building, the offline designation thereby preventing constant retries to connect to the communications network and preserving power on the network device, wherein the one or more selected second physical locations of the network device in the building when it is offline correspond to selected virtual locations on the electronic floorplan for the building, allowing automatic synchronizing of all energy audit data collected at the one or more selected second physical locations on the electronic floorplan when the network device is offline at a later time when the network device is again connected to the communications network;

(3) receiving a creation selection input on the energy audit application on the network device to create a graphical marker for a selected energy consuming component at a specific location on the electronic floorplan of the building;

(4) displaying the graphical marker in the first color on the energy audit application on the network device at the specific location on the electronic floorplan of the building for the selected energy consuming component;

(5) presenting one or more questions from a template wizard on the energy audit application on the network device for the selected energy consuming component to determine whether any additional information fields are desired to be added to the selected energy consuming component not already included on the configurable electronic template;

(6) receiving one or more answer selection inputs including answers to the presented one or more questions on the template wizard on the energy audit application on the network device;

(7) dynamically and automatically adding with the template wizard on the energy audit application on the network device any desired additional informational fields to the configurable electronic template included in the one or more answer selection inputs for the selected energy consuming component;

(8) receiving a plurality of collection selection inputs on the energy audit application on network device including: (a) audio information from an audio component on the network device (b) visual information from a camera component on the network device, and (c) electronic information from an electronic keyboard component on the network device, the audio, visual and electronic information including information collected for the selected energy consuming component at the specific location on the electronic floorplan of the building;

(9) storing the received audio, visual and electronic information in the configurable electronic template on the energy audit application on network device;

(10) displaying the graphical marker in the second color on the energy audit application on the network device at the specific location on the electronic floorplan of the building for the selected energy consuming component visually indicating energy audit information collected for selected energy consuming components has been completed or displaying the graphical marker in the third color on the energy audit application on the network device at the specific location on the electronic floorplan of the building for the selected energy consuming component visually indicating a problem exists with the selected energy consuming component that requires additional action;

repeating steps (1)-(10) for a plurality of other selected energy consuming components at a plurality of other specific locations on the electronic floorplan of the building;

creating an energy audit summary report on the energy audit application on the network device with the stored audio, visual and electronic information, wherein the energy audit summary report is dynamically updated on the energy audit application on the network device as energy consuming components are identified in the building;

moving the network device to a new physical location inside or outside of the building that allows the network device to connect to the communications network via the communications interface on the network device;

connecting automatically from the energy audit application on the network device via the communications interface on the network device to a server energy audit application on a server network device with one or more processor via the communications network; and automatically synchronizing data stored on the energy audit application on network device with the server energy audit application on the server network device, thereby allowing energy audit information for the electronic floorplan of the building to be identical on the network device and the server network device.

2. The method of claim 1, further comprising:
changing one or more graphical markers from the first color to a second color on the energy audit application on the network device at selected specific locations on the electronic floorplan of the building to visually indicate where information for selected energy producing components has been completed.

3. The method of claim 1, wherein the energy consuming components include lighting, heating, ventilation, air conditioning, motors, variable frequency drives, transformers, generators and combinations thereof.

4. The method of claim 1, further comprising:
collecting audio, visual, electronic information or Light Detection and Ranging (LIDR) information from energy producing components on an energy audit application on network device.

5. The method of claim 4, wherein the energy producing components include solar, wind, water, biomass energy producing components and combinations thereof.

6. The method of claim 1, wherein step (8) receiving a plurality of collection selection inputs on the energy audit application on network device further includes:

applying automatically one or more Artificial Intelligence (AI) methods to the audio, visual and electronic information collected for the selected energy consuming component to provide additional information about the selected energy consuming component.

7. The method of claim 1, further comprising:
applying automatically on the server energy audit application on the server network device one or more Artificial Intelligence (AI) methods to the audio, visual and electronic information collected for the selected energy consuming component and the selected other plurality of energy consuming components to provide additional information about the plurality of selected energy consuming components.

8. The method of claim 7, wherein the additional information about plurality of selected energy consuming components includes one or more electronic links to one or more information sources including existing electronic product and price information about the existing plurality of selected energy consuming components and new electronic information and new price information for new energy consuming components that can replace the existing plurality of selected energy consuming components in the building.

9. The method of claim 1, further comprising:
automatically synchronizing data continuously stored on the energy audit application on network device with the server energy audit application on the server network device via the communications network every time the network device connects to the communications network, thereby allowing energy audit information for the electronic floorplan of the building to be identical on the network device and the server network device until all energy consuming components in the building have been identified and recorded;
producing a final energy audit report on the energy audit application on the network device, the final energy audit report including one or more electronic links to one or more information sources including existing electronic product and price information about the existing plurality of selected energy consuming components and new electronic information and new price information for new energy consuming components that can replace the existing plurality of selected energy consuming components in the building; and
sending the final energy audit report from the energy audit application on the network device to the server energy audit application on the server network device via the communications network for use in the building.

10. The method of claim 1, wherein the graphical marker includes a specific graphical marker representing and graphically illustrating a specific type of energy consuming component.

11. The method of claim 1, wherein the energy audit summary report includes information for replacing or retrofitting the energy consuming components with new energy consuming components.

12. The method of claim 1, wherein the electronic floorplan of the building is created with a Computer Aided Design (CAD), Building Information Modeling (BIM) or other three-dimensional (3D) modeling program.

13. The method of claim 1, wherein the visual information captured on the camera component on the network device includes still pictures, video, and 360-degree view visual information.

14. The method of claim 1, wherein the network device further includes one or more additional sensing components to measure distance, location, energy output, light output, airflow, electrical input and output, water flow, pressure or temperature of the energy consuming components.

15. The method of claim 1, wherein the energy audit application on the network device includes the template wizard to assist in creating a plurality of new data fields in the configurable electronic template not already included in the configurable electronic template.

16. The method of claim 1, wherein the energy audit application on the network device includes a graphical energy consuming component fixture wizard with a plurality of selectable graphical objects that visually identify a plurality of different energy consuming components to ensure each energy consuming component is fully defined and consistently identified.

17. The method of claim 1, wherein the energy audit application on the network device includes a graphical energy producing component fixture wizard with a plurality of selectable graphical objects that visually identify a plurality of different energy producing components to ensure each energy producing component is fully defined and consistently identified.

18. The method of claim 1, wherein the network device, the server network device include one or more wireless communications interfaces comprising: cellular telephone, 802.11a, 802.11b, 802.11g, 802.11n, 802.15.4 (ZigBee), Wireless Fidelity (Wi-Fi), Wi-Fi Aware, Worldwide Interoperability for Microwave Access (WiMAX), ETSI High Performance Radio Metropolitan Area Network (HIPERMAN), Aeronautical Mobile Service (AMS), Near Field Communications (NFC), Machine-to-Machine (M2M), 802.15.1 (Bluetooth), or infra data association (IrDA), wireless communication interfaces.

19. The method of claim 1, wherein network device includes: desktop computers, laptop computers, tablet computers, mobile phones, smart phones, personal digital/data assistants (PDA), digital cameras, 360-degree cameras, Light Detection and Ranging (LIDR) devices, unmanned aerial vehicles (UAVs), driverless vehicles, portable game consoles, wearable network devices or Internet of Things (IoT) devices.

20. The method of claim 1, wherein the server network device includes a plurality of cloud applications available to the network device and one or more cloud databases communicating with a cloud communications network, the plurality of cloud applications providing a plurality of Energy Audit cloud services including: a cloud computing Infrastructure as a Service (IaaS), a cloud computing Platform as a Service (PaaS) and an energy audit application component as a Software as a Service (SaaS).

21. The method of claim 20, wherein the one or more cloud databases include one or more cloud storage objects comprising one or more of a Representational State Transfer (REST) or Simple Object Access Protocol (SOAP), Lightweight Directory Access Protocol (LDAP) cloud storage objects, portions thereof, or combinations thereof, stored in the one or more cloud databases.

22. A non-transitory computer readable medium having stored therein a plurality of instructions for executing the steps of:
providing an electronic floorplan of a building for conducting an energy audit of energy consuming components on an energy audit application on a network device with one or more processors, a non-transitory computer readable medium and a communications interface for connecting the network device to a communications network;

providing via the energy audit application a creation component to create and change colors for plurality of graphical markers for energy consuming components at specific locations on the electronic floorplan of the building, the plurality of graphical markers including progress indicators comprising a first color for a selected energy consuming component indicating energy audit information has not been collected for the selected energy consuming component, a second color indicating the energy audit information has been collected for the selected energy consuming component and a third color indicating a problem exists with the selected energy consuming component that requires additional action;

providing via the energy audit application a template wizard presenting questions to be answered to assist in creating a plurality of new data fields in a configurable electronic template with a plurality of information fields;

providing the configurable electronic template on energy audit application the network device for conducting the energy audit of the energy consuming components, the configurable electronic template dynamically configurable during the energy audit;

(1) moving the network device physically into the building to a plurality of first different physical locations within the building, wherein the network device is connected to the communications network;

(2) moving the network device to one or more selected second physical locations wherein the building materials of the building prevent a successful connection to the communications network and the network device is designated as offline and not connected to the communication network within the building, the offline designation thereby preventing constant retries to connect to the communications network and preserving power on the network device, wherein the one or more selected second physical locations of the network device in the building when it is offline correspond to selected virtual locations on the electronic floorplan for the building, allowing automatic synchronizing of all energy audit data collected at the one or more selected second physical locations on the electronic floorplan when the network device is offline at a later time when the network device is again connected to the communications network;

(3) receiving a creation selection input on the energy audit application on the network device to create a graphical marker for a selected energy consuming component at a specific location on the electronic floorplan of the building;

(4) displaying the graphical marker in the first color on the energy audit application on the network device at the specific location on the electronic floorplan of the building for the selected energy consuming component;

(5) presenting one or more questions from a template wizard on the energy audit application on the network device for the selected energy consuming component to determine whether any additional information fields are desired to be added to the selected energy consuming component not already included on the configurable electronic template;

(6) receiving one or more answer selection inputs including answers to the presented one or more questions on the template wizard on the energy audit application on the network device;

(7) dynamically and automatically adding with the template wizard on the energy audit application on the network device any desired additional informational fields to the configurable electronic template included in the one or more answer selection inputs for the selected energy consuming component;

(8) receiving a plurality of collection selection inputs on the energy audit application on network device including: (a) audio information from an audio component on the network device (b) visual information from a camera component on the network device, and (c) electronic information from an electronic keyboard component on the network device, the audio, visual and electronic information including information collected for the selected energy consuming component at the specific location on the electronic floorplan of the building;

(9) storing the received audio, visual and electronic information in the configurable electronic template on the energy audit application on network device;

(10) displaying the graphical marker in the second color on the energy audit application on the network device at the specific location on the electronic floorplan of the building for the selected energy consuming component visually indicating energy audit information collected for selected energy consuming components has been completed or displaying the graphical marker in the third color on the energy audit application on the network device at the specific location on the electronic floorplan of the building for the selected energy consuming component visually indicating a problem exists with the selected energy consuming component that requires additional action;

repeating steps (1)-(10) for a plurality of other selected energy consuming components at a plurality of other specific locations on the electronic floorplan of the building;

creating an energy audit summary report on the energy audit application on the network device with the stored audio, visual and electronic information, wherein the energy audit summary report is dynamically updated on the energy audit application on the network device as energy consuming components are identified in the building;

moving the network device to a new physical location inside or outside of the building that allows the network device to connect to the communications network via the communications interface on the network device;

connecting automatically from the energy audit application on the network device via the communications interface on the network device to a server energy audit application on a server network device with one or more processor via the communications network; and automatically synchronizing data stored on the energy audit application on network device with the server energy audit application on the server network device, thereby allowing energy audit information for the electronic floorplan of the building to be identical on the network device and the server network device.

23. A system for automatically providing energy audits, comprising in combination:

a plurality of network devices each with one or more processors and a non-transitory computer readable medium;

one or more server network devices each with one or more processors and a non-transitory computer readable medium;

a communications network;

for providing an electronic floorplan of a building for conducting an energy audit of energy consuming components on an energy audit application on a network device with one or more processors, a non-transitory computer readable medium and a communications interface for connecting the network device to a communications network;

for providing via the energy audit application a creation component to create and change colors for plurality of graphical markers for energy consuming components at specific locations on the electronic floorplan of the building, the plurality of graphical markers including progress indicators comprising a first color for a selected energy consuming component indicating energy audit information has not been collected for the selected energy consuming component, a second color indicating the energy audit information has been collected for the selected energy consuming component and a third color indicating a problem exists with the selected energy consuming component that requires additional action;

for providing via the energy audit application a template wizard presenting questions to be answered to assist in creating a plurality of new data fields in a configurable electronic template with a plurality of information fields;

for providing the configurable electronic template on energy audit application the network device for conducting the energy audit of the energy consuming components, the configurable electronic template dynamically configurable during the energy audit;

(1) for moving the network device physically into the building to a plurality of first different physical locations within the building, wherein the network device is connected to the communications network;

(2) for moving the network device to one or more selected second physical locations wherein the building materials of the building prevent a successful connection to the communications network and the network device is designated as offline and not connected to the communication network within the building, the offline designation thereby preventing constant retries to connect to the communications network and preserving power on the network device, wherein the one or more selected second physical locations of the network device in the building when it is offline correspond to selected virtual locations on the electronic floorplan for the building, allowing automatic synchronizing of all energy audit data collected at the one or more selected second physical locations on the electronic floorplan when the network device is offline at a later time when the network device is again connected to the communications network;

(3) for receiving a creation selection input on the energy audit application on the network device to create a graphical marker for a selected energy consuming component at a specific location on the electronic floorplan of the building;

(4) for displaying the graphical marker in the first color on the energy audit application on the network device at the specific location on the electronic floorplan of the building for the selected energy consuming component;

(5) for presenting one or more questions from a template wizard on the energy audit application on the network device for the selected energy consuming component to determine whether any additional information fields are desired to be added to the selected energy consuming component not already included on the configurable electronic template;

(6) for receiving one or more answer selection inputs including answers to the presented one or more questions on the template wizard on the energy audit application on the network device;

(7) for dynamically and automatically adding with the template wizard on the energy audit application on the network device any desired additional informational fields to the configurable electronic template included in the one or more answer selection inputs for the selected energy consuming component;

(8) for receiving a plurality of collection selection inputs on the energy audit application on network device including: (a) audio information from an audio component on the network device (b) visual information from a camera component on the network device, and (c) electronic information from an electronic keyboard component on the network device, the audio, visual and electronic information including information collected for the selected energy consuming component at the specific location on the electronic floorplan of the building;

(9) for storing the received audio, visual and electronic information in the configurable electronic template on the energy audit application on network device;

(10) for displaying the graphical marker in the second color on the energy audit application on the network device at the specific location on the electronic floorplan of the building for the selected energy consuming component visually indicating energy audit information collected for selected energy consuming components has been completed or displaying the graphical marker in the third color on the energy audit application on the network device at the specific location on the electronic floorplan of the building for the selected energy consuming component visually indicating a problem exists with the selected energy consuming component that requires additional action;

for repeating steps (1)-(10) for a plurality of other selected energy consuming components at a plurality of other specific locations on the electronic floorplan of the building;

for creating an energy audit summary report on the energy audit application on the network device with the stored audio, visual and electronic information, wherein the energy audit summary report is dynamically updated on the energy audit application on the network device as energy consuming components are identified in the building;

for moving the network device to a new physical location inside or outside of the building that allows the network device to connect to the communications network via the communications interface on the network device;

for connecting automatically from the energy audit application on the network device via the communications interface on the network device to a server energy audit application on a server network device with one or more processor via the communications network; and for automatically synchronizing data stored on the energy audit application on network device with the server energy audit application on the server network device, thereby allowing energy audit information for the electronic floorplan of the building to be identical on the network device and the server network device.

* * * * *